US009929338B2

(12) United States Patent
Shi et al.

(10) Patent No.: US 9,929,338 B2
(45) Date of Patent: Mar. 27, 2018

(54) SPIN CURRENT DEVICES AND METHODS OF FABRICATION THEREOF

(71) Applicant: The Regents Of The University Of California, Oakland, CA (US)

(72) Inventors: Jing Shi, Riverside, CA (US); Junxue Li, Riverside, CA (US); Yadong Xu, Riverside, CA (US); Mohammed Aldosary, Riverside, CA (US); Chi Tang, Riverside, CA (US); Roger Lake, Riverside, CA (US)

(73) Assignee: The Regents Of The University Of California, Oakland, CA (US)

( * ) Notice: Subject to any disclaimer, the term of this patent is extended or adjusted under 35 U.S.C. 154(b) by 0 days.

(21) Appl. No.: 15/289,850

(22) Filed: Oct. 10, 2016

(65) Prior Publication Data
US 2017/0104150 A1    Apr. 13, 2017

Related U.S. Application Data

(60) Provisional application No. 62/239,525, filed on Oct. 9, 2015.

(51) Int. Cl.
*H01L 29/82* (2006.01)
*H01L 43/04* (2006.01)
(Continued)

(52) U.S. Cl.
CPC ............ *H01L 43/04* (2013.01); *H01L 43/065* (2013.01); *H01L 43/08* (2013.01); *H01L 43/10* (2013.01); *H01L 43/14* (2013.01); *H01L 37/00* (2013.01)

(58) Field of Classification Search
USPC ...... 365/173, 171, 158; 360/313, 128, 234.5; 257/421, 427, E21.665, E29.323, 422,
(Continued)

(56) References Cited

U.S. PATENT DOCUMENTS

| 2010/0289098 | A1* | 11/2010 | Li | ............................ | G11C 11/16 |
| | | | | | 257/421 |
| 2014/0063895 | A1* | 3/2014 | Li | ............................ | H01L 27/22 |
| | | | | | 365/97 |

(Continued)

OTHER PUBLICATIONS

Althammer, M. et al., Quantitative study of the spin Hall magnetoresistance in ferromagnetic insulator/normal metal hybrids. Phys. Rev. B, 87, 224401 (2013).
(Continued)

*Primary Examiner* — Tram H Nguyen
(74) *Attorney, Agent, or Firm* — Mintz Levin Cohn Ferris Glovsky and Popeo, P.C.; William B. Kezer; Michael A. Mattoni

(57) ABSTRACT

Pure spin current devices are provided. The devices include sandwich structures of metal/magnetic insulator/metal. A first current injected in a first metal layer generates a pure spin current. The spin current can be switched between "on" and "off" states by controlling an in-plane magnetization orientation of the magnetic insulator. In the "on" state, the pure spin current is transmitted from the first metal layer to the second metal layer, through the magnetic insulator layer. The pure spin current in the second metal layer induces generation of a second charge current. In the "off" state, the pure spin current is absorbed at the interface between the first metal layer and the metal insulator. Such structures can serve as pure spin current valve devices or provide analog functionality, as rotating the in-plane magnetization provides analog sinusoidal modulation of the spin current.

20 Claims, 24 Drawing Sheets

(51) Int. Cl.
H01L 43/10 (2006.01)
H01L 43/14 (2006.01)
H01L 43/06 (2006.01)
H01L 43/08 (2006.01)
H01L 37/00 (2006.01)

(58) Field of Classification Search
USPC ..... 257/68–71, 295–309, 905–908, E21.579, 257/776, E21.586, 773, 374, 499–564, 257/763, 757; 438/762, 639, 643, 687, 438/637, 485, 785, 582, 19, 15, 3, 669, 438/709, 730, 579, 299, 448, 396, 253, 438/200, 656, 275–278
See application file for complete search history.

(56) References Cited

U.S. PATENT DOCUMENTS

2014/0169085 A1* 6/2014 Wang .................. G11C 11/161
365/158
2015/0200003 A1* 7/2015 Buhrman ............... G11C 11/18
365/158
2017/0077392 A1* 3/2017 Han ..................... H01L 43/065

OTHER PUBLICATIONS

B. Heinrich, C. Burrowes, E. Montoya, B. Kardasz, E. Girt, Y. Y. Song, Y. Sun, and M. Wu, Phys. Rev. Lett., 107, 066604 (2010).
Baibich, M. N. et al. Giant Magnetoresistance of (001)Fe/(001)Cr Magnetic Superlattices. Phys. Rev. Lett., 61, 2472 (1988).
Berger, L. Emission of spin waves by a magnetic multilayer traversed by a current. Phys. Rev. B, 54, 9353 (1996).
Binasch, G., Grunberg, P., Saurenbach, F. & Zinn, W. Enhanced magnetoresistance in layered magnetic structures with antiferromagnetic interlayer exchange. Phys. Rev. B, 39, 4828 (1989).
C. Burrowes, B. Heinrich, B. Kardasz, E. A. Montoya, E. Girt, Y. Sun, Y.-Y. Song, and M. Wu, Appl. Phys. Lett., 100, 092403 (2012).
C. Tang, M. Aldosary, Z. Jiang, H. Chang, B. Madon, K. Chan, M. Wu, J. E. Garay, and J. Shi, Appl. Phys. Lett., 108, 102403 (2016).
Chen, Y.-T. et al. Theory of spin Hall magnetoresistance. Phys. Rev. B, 87, 144411 (2013).
Cornelissen, L. J. et al. Long distance transport of magnon spin information in a magnetic insulator at room temperature. Nat. Phys., 11, 453-461 (2015).
D. Meier, D. Reinhardt, M. van Straaten, C. Klewe, M. Althammer, M. Schreier, S. T. B. Goennenwein, A. Gupta, M. Schmid, C. H. Back, J.-M. Schmalhorst, T. Kuschel, and G. Reiss, Nat. Commun. 6, 8211 (2015).
D. Qu, S. Y. Huang, J. Hu, R. Wu, and C. L. Chien, Phys. Rev. Lett., 110, 067206 (2013).
Demokritov, S. O., Hillebrands, B. & Slavin, A. N. Brillouin light scattering studies of confined spin waves: linear and nonlinear confinement. Phys. Rep., 348, 441-489 (2001).
Dyakonov, M. I. & Perel, V. I. Current-induced spin orientation of electrons in semiconductors. Phys. Lett. A, 35, 459-460 (1971).
Geller and M. A. Gilleo, Acta Crystallogr. 10, 239 (1957).
Giles, B. L., Yang, Z., Jamison, J. & Myers, R. C. Long range pure magnon spin diffusion observed in a non-local spin-Seebeck geometry. Phys. Rev. B 92, 224415 (2015).
Goennenwein, S. T. B. et al. Non-local magnetoresistance in YIG/Pt nanostructures. Appl. Phys. Lett. 107, 172405 (2015).
H. Chang, P. Li, W. Zhang, T. Liu, A. Hoffmann, L. Deng, and M. Wu, IEEE Magn. Lett., 5, 6700104 (2014).
H. Nakayama, M. Althammer, Y.-T. Chen, K. Uchida, Y. Kajiwara, D. Kikuchi, T. Ohtani, S. Geprägs, M. Opel, S. Takahashi, R. Gross, G. E. W. Bauer, S. T. B. Goennenwein, and E. Saitoh, Phys. Rev. Lett., 110, 206601 (2013).
Hahn, C. et al., Comparative measurements of inverse spin Hall effects and magnetoresistance in YIG/Pt and YIG/Ta. Phys. Rev. B, 87, 174417 (2013).

Hirsch, J. E. Spin Hall effect. Phys. Rev. Lett., 83, 1834-1837 (1999).
Huang, S. Y. et al., Transport magnetic proximity effects in platinum. Phys. Rev. Lett., 109, 107204 (2012).
J. Li, Y. Xu, M. Aldosary, C. Tang, Z. Lin, S. Zhang, R. Lake, and J. Shi, Nat. Commun., 7, 10858 (2016).
J. Lustikova, Y. Shiomi, Z. Qiu, T. Kikkawa, R. Iguchi, K. Uchida, and E. Saitoh, J. Appl. Phys., 116, 153902 (2014).
Jiang Z. et al., Independent Tuning of Electronic Properties and Induced Ferromagnetism in Topological Insulators with Heterostructure Approach. Nano Lett., 15(9), 5835-5840(2015).
Jiang, Z. et al., A comparative transport study of Bi2Se3 and Bi2Se3/yttrium iron garnet. Appl. Phys. Lett., 104, 222409 (2014).
Jin, H., Boona, S. R., Yang, Z., Myers, R. C. & Heremans, J. P. Effect of the magnon dispersion on the longitudinal spin Seebeck effect in yttrium iron garnets. Phys. Rev. B, 92, 054436 (2015).
Kajiwara, Y. et al. Transmission of electrical signals by spin-wave interconversion in a magnetic insulator. Nature, 464, 262-266 (2010).
Kikkawa, T. et al., Critical suppression of spin Seebeck effect by magnetic fields. Phys. Rev. B, 92, 064413 (2015).
Kimura, T., Otani, Y., Sato, T., Takahashi, S. & Maekawa, S. Room-temperature reversible spin Hall effect. Phys. Rev. Lett., 98, 156601 (2007).
Lin, T. et al. Experimental Investigation of the Nature of the Magnetoresistance Effects in Pd-YIG Hybrid Structures. Phys. Rev. Lett., 113, 037203 (2014).
Lin, T. et al., Experimental Investigation of the Nature of the Magnetoresistance Effectsin Pd-YIG Hybrid Structures. Phys. Rev. Lett., 113, 037103 (2014).
Lin, T. et al., J. Induced magneto-transport properties at palladium/ yttrium iron garnet interface. Appl. Phys. Lett., 103, 132407 (2013).
Liu, L. Q. et al. Spin torque switching with the giant spin Hall effect of tantalum. Science, 336, 555-558 (2012).
Lu, Y. M. et al., Hybrid magnetoresistance in the proximity of a ferromagnet. Phys. Rev. B, 87, 220409 (2013).
Lu, Y. M. et al., Pt Magnetic Polarization on Y3Fe5O12 and Magnetotransport Characteristics. Phys. Rev. Lett., 110, 147207 (2013).
M. C. Onbasli, A. Kehlberger, D. H. Kim, G. Jakob, M. Klaui, A. V. Chumak, B. Hillebrands, and C. A. Ross, Apl Mater. 2, 106102 (2014).
M. Schreier, A. Kamra, M. Weiler, J. Xiao, G. E. W. Bauer, R. Gross, and S. T. B. Goennenwein, Phys. Rev. B, 88, 094410 (2013).
M. Weiler, M. Althammer, M. Schreier, J. Lotze, M. Pernpeintner, S. Meyer, H. Huebl, R. Gross, A. Kamra, J. Xiao, Y.-T. Chen, H. J. Jiao, G. E. W. Bauer, and S. T. B. Goennenwein, Phys. Rev. Lett., 111, 176601 (2013).
Miron, I. M. et al. Perpendicular switching of a single ferromagnetic layer induced by in-plane current injection. Nature, 476, 189-193 (2011).
Morota, M. et al. Indication of intrinsic spin Hall effect in 4d and 5d transition metals. Phys. Rev. B, 83, 174405 (2011).
Mosendz, O. et al. Quantifying Spin Hall Angles from Spin Pumping: Experiments and Theory. Phys. Rev. Lett., 104, 046601 (2010).
Nakayama, H. et al., Spin Hall Magnetoresistance Induced by a Non-equilibrium Proximity Effect. Phys. Rev. Lett., 110, 206601 (2013).
R. C. Linares, R. B. Graw, and J. B. Schroeder, J. Appl. Phys., 36, 2884 (1965).
S. S.-L. Zhang and S. Zhang, Phys. Rev. Lett., 109, 096603 (2012).
Saitoh, E. et al. Conversion of spin current into charge current at room temperature: Inverse spin-Hall effect. Appl. Phys. Lett., 88, 182509 (2006).
Schreier, M. et al. Magnon, phonon, and electron temperature profiles and the spin Seebeck effect in magnetic insulator/normal metal hybrid structures. Phys. Rev. B, 88, 094410 (2013).
Serga, A. A., Chumak, A. V. & Hillebrands, B. YIG magnonics. J. Phys. D, 43, 264002 (2010).
Slonczewski, J. C., Current-driven excitation of magnetic multilayers. J. Magn. Magn. Mater. 159, L1 (1996).
T. Lin, C. Tang, H. M. Alyahayaei, and J. Shi, Phys. Rev. Lett., 113, 037203 (2014).

(56) References Cited

OTHER PUBLICATIONS

Takahashi, S., Saitoh, E. & Maekawa, S. Spin current through a normal-metal/insulating-ferromagnet Junction. J. Phys. Conf. Ser., 200, 062030 (2010).
Tanaka, T. et al. Intrinsic spin Hall effect and orbital Hall effect in 4d and 5d transition metals. Phys. Rev. B, 77, 165117 (2008).
Uchida, K. et al. Spin Seebeck insulator. Nat. Mater. 9, 894-7 (2010).
V. Chumak, A. A. Serga, and B. Hillebrands, Nat. Commun., 5, 4700 (2014).
Valenzuela, S. O. & Tinkham, M. Direct electronic measurement of the spin Hall effect. Nature, 442, 176-179 (2006).
Vlaminck, V. et al. Dependence of spin-pumping spin Hall effect measurements on layer thicknesses and stacking order. Phys. Rev. B, 88, 064414 (2013).
Vlietstra, N. et al., Spin-Hall magnetoresistance in platinum on yttrium iron garnet: Dependence on platinum thickness and in-plane/out-of-plane magnetization. Phys. Rev. B, 87, 184421 (2013).
X. Jia, K. Liu, K. Xia, and G. E. Bauer, Europhys. Lett. 96, 17005 (2011).
Y. Krockenberger, H. Matsui, T. Hasegawa, M. Kawasaki, and Y. Tokura, Appl. Phys. Lett., 93, 092505 (2008).
Y. M. Lu, J. W. Cai, S. Y. Huang, D. Qu, B. F. Miao, and C. L. Chien, Phys. Rev. B, 87, 220409 (2013).
Y.-T. Chen, S. Takahashi, H. Nakayama, M. Althammer, S. T. B. Goennenwein, E. Saitoh, and G. E. W. Bauer, Phys. Rev. B, 87, 144411 (2013).
Zhang, S. F. Spin Hall effect in the presence of spin diffusion. Phys. Rev. Lett., 85, 393-396 (2000).
Zhang, S. S.-L. & Zhang, S. Magnon Mediated Electric Current Drag Across a Ferromagnetic Insulator Layer. Phys. Rev. Lett., 109, 096603 (2012).
Zhang, S. S.-L. & Zhang, S. Spin convertance at magnetic interfaces. Phys. Rev. B, 86, 214424 (2012).
Zhang, W. et al. Spin Hall Effects in Metallic Antiferromagnets. Phys. Rev. Lett. 113, 196602 (2014).
Rezende, S.M. et al. (2014). "Thermal Properties of Magnons and the Spin Seebeck Effect in Yttrium Iron Garnet/Normal Metal Hybrid Structures," *Phys. Rev. B*, 89, 134406.

\* cited by examiner

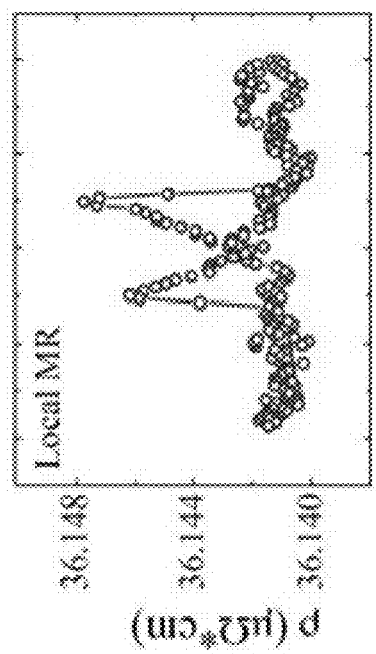
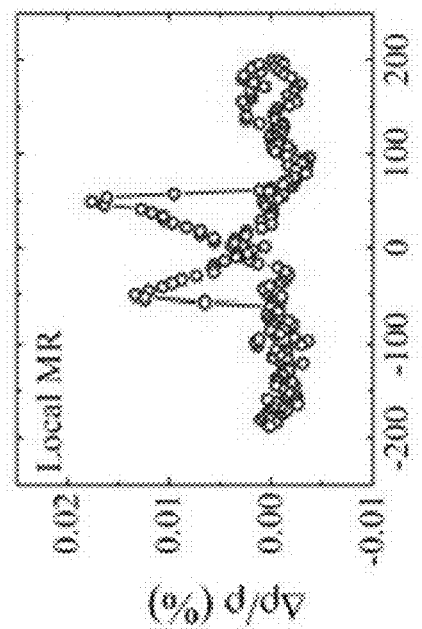
FIG. 12c
FIG. 12d
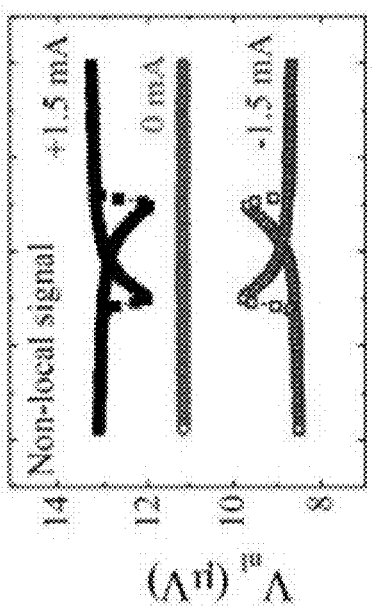
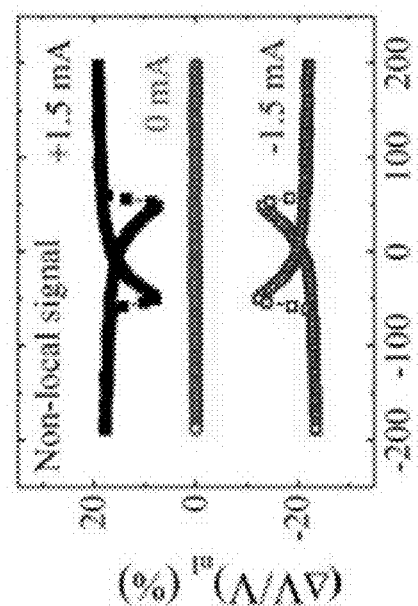
FIG. 12a
FIG. 12b

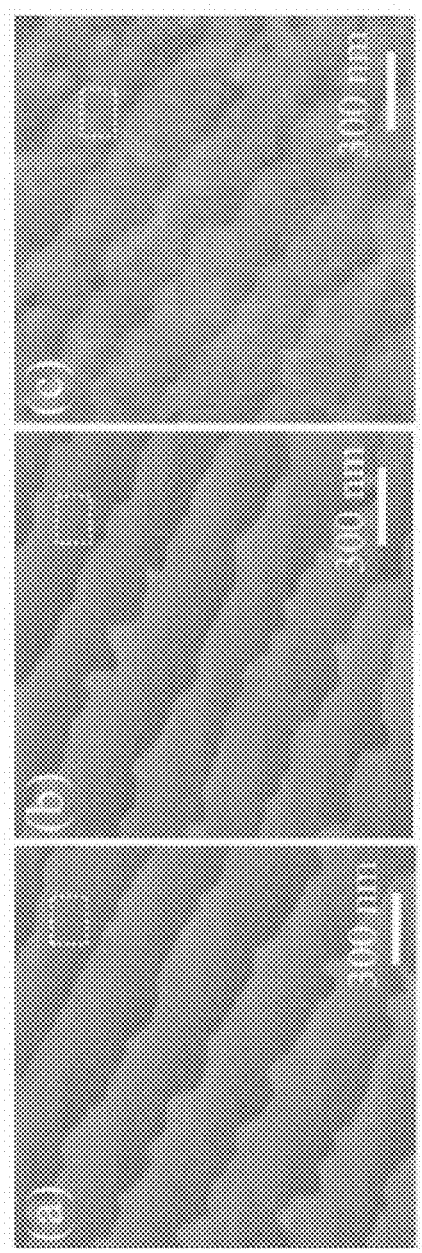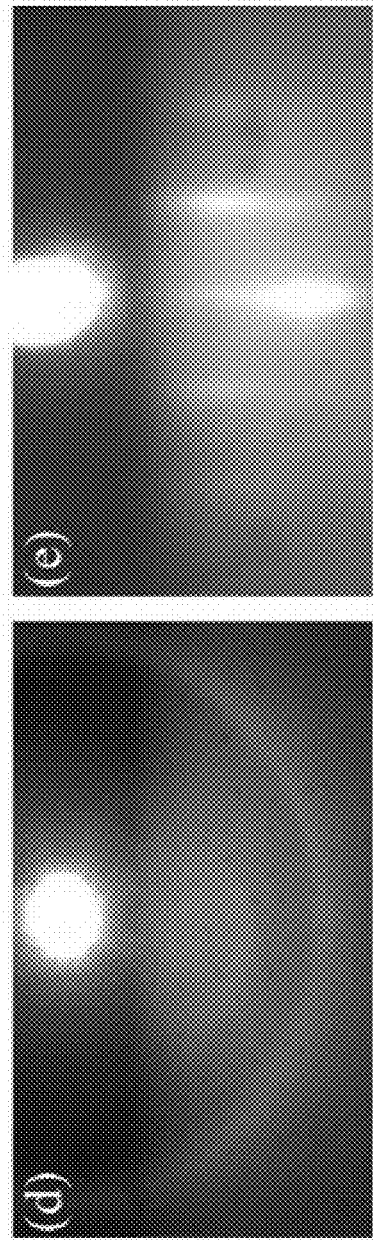
FIG. 16a  FIG. 16b  FIG. 16c  FIG. 16d  FIG. 16e

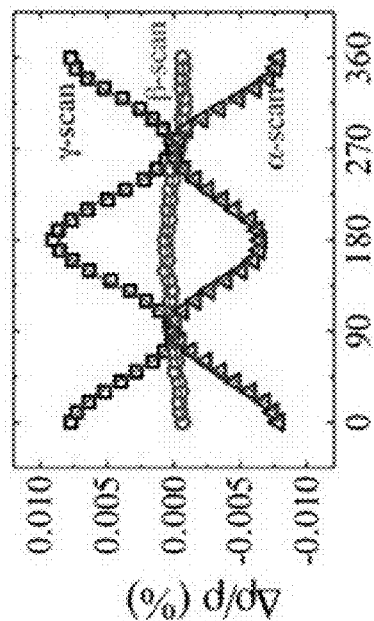
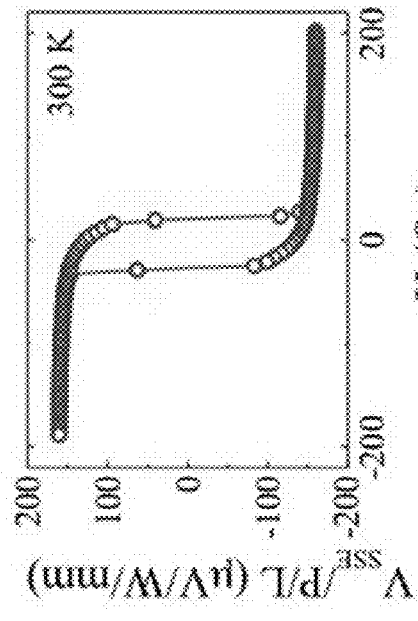
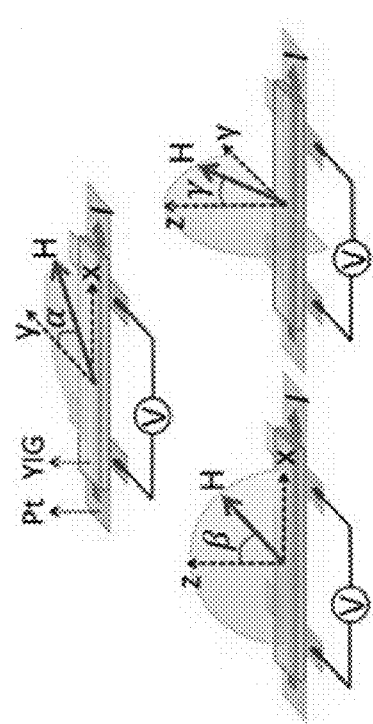
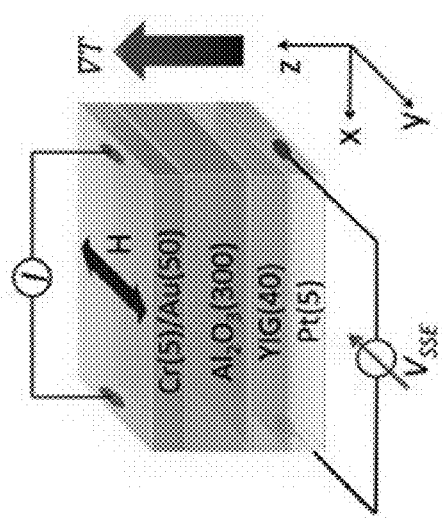
FIG. 19a
FIG. 19b
FIG. 19c
FIG. 19d

SPIN CURRENT DEVICES AND METHODS OF FABRICATION THEREOF

CROSS-REFERENCE TO RELATED APPLICATION(S)

This application claims the benefit of U.S. Provisional Application No. 62/239,525, filed on Oct. 9, 2015, and entitled, "SPIN CURRENT DEVICES AND METHOD OF FABRICATION THEREOF," the entire teachings of which are incorporated herein by reference.

GOVERNMENT SUPPORT

The invention was supported, in whole or in part, under Award #SC0012670 from the U.S. Department of Energy. The Government has certain rights in the invention.

BACKGROUND

Angular momentum is a fundamental property of motion. For elementary particles such as electrons, the total angular momentum is given by the sum of orbital angular momentum and spin angular momentum. Orbital angular momentum arises from the orbit of the electron about a nucleus. Spin angular momentum, also referred to as spin, is the remaining angular momentum of the electron not associated with orbital motion of the electron. Spin can be likened to a vector quantity, with a direction and a quantized magnitude given by n/2, where n is a non-negative integer.

Spintronics is the study of the spin of electrons and its associated magnetic moment in solid state devices, amongst other properties, and involves manipulation of spins by magnetic and electrical fields. There exists an ongoing need for improved systems and methods for manipulating spin in solid state devices.

SUMMARY

In an embodiment, a pure spin current valve device is provided. The device includes a first metal layer, a magnetic insulator layer, and a second metal layer. The first metal layer extends within a first plane defined by first and second orthogonal axes. The second metal layer extends within a second plane approximately parallel to the first plane. The magnetic insulator layer extends within a third plane approximately parallel to the first plane. The magnetic insulator further contacts the first metal layer at a first interface and contacts the second metal layer at a second interface, the first and second interfaces opposing one other. The first metal layer is configured to generate a pure spin current upon receipt of a first electrical current, the pure spin current flowing towards the first interface in a direction of a third axis, orthogonal to the first and second axes, and possessing a spin current polarization ($\vec{\sigma}$) oriented parallel to the first plane. The magnetic insulator layer is configured to exhibit a magnetization ($\vec{M}$) oriented parallel to the second plane and at an angle ($\theta$) with respect to the spin current polarization. The second metal layer is configured to generate a second current upon receipt of the pure spin current from the magnetic insulator layer.

Embodiments of the pure spin current device may include one or more of the following, in any combination.

In an embodiment of the device, the second current is proportional to the first current when $\theta=0°$.

In an embodiment of the device, the second current is zero when the magnetization is perpendicular to the spin current polarization.

In an embodiment of the device, the second current is non-zero when the first current is non-zero and when the magnetization is not perpendicular to the spin current polarization.

In an embodiment of the device, the first and second metal layers are each independently selected from metals selected from the group consisting of platinum (Pt), tantalum (Ta), tungsten (W), bismuth (Bi), and alloys thereof.

In an embodiment of the device, the first and second metal layers possess a spin hall angle greater than or equal to 1%.

In an embodiment of the device, the magnetic insulator layer comprises a magnetic insulator material selected from the group consisting of yttrium aluminum garnet (YIG), and rare earth iron garnets (ReIG). In further embodiments, the magnetic insulator layer may be formed from antiferromagnetic materials.

In an embodiment of the device, the substrate comprises a rare earth iron garnet selected from europium iron garnet (EuIG) and lutetium iron garnet (LuIG).

In an embodiment, the device further comprises a substrate underlying one of the first and second metal layers, the substrate comprising a material selected from the group consisting of gadolinium gallium garnet (GGG; $Gd_3Ga_5O_{12}$), yttrium aluminum garnet (YAG; $Y_3Al_5O_{15}$), strontium titanium oxide (STO; $SrTiO_3$), neodymium gallium garnet (NGG; $Nd_3Ga_5O_{12}$), and silicon (Si).

In an embodiment of the device, a root mean squared (RMS) roughness of the substrate is approximately 10% or less than the thickness of the overlying first or second metal layer.

In an embodiment, a method of forming a pure spin current valve is provided. The method includes forming a first metal layer on a substrate layer, forming a magnetic insulator layer on the first metal layer, and forming a second metal layer on the magnetic insulator layer. The first metal layer is configured to generate a pure spin current upon receipt of a first electrical current, the pure spin current flowing towards the first interface in a direction of a third axis, orthogonal to the first and second axes, and possessing a spin current polarization ($\vec{\sigma}$) oriented parallel to the first plane. The magnetic insulator layer is configured to exhibit a magnetization ($\vec{M}$) oriented parallel to the second plane and at an angle ($\theta$) with respect to the spin current polarization. The second metal layer is configured to generate a second current upon receipt of the pure spin current from the magnetic insulator layer.

Embodiments of the method may include one or more of the following, in any combination.

In an embodiment of the method, the second current is proportional to the first current when $\theta=0°$.

In an embodiment of the method, the second current is zero when the magnetization is perpendicular to the spin current polarization.

In an embodiment of the method, the second current is non-zero when the first current is non-zero and when the magnetization is not perpendicular to the spin current polarization.

In an embodiment of the method, the first and second metal layers are each independently selected from metals selected from the group consisting of platinum (Pt), tantalum (Ta), tungsten (W), bismuth (Bi), and alloys thereof.

In an embodiment of the method, the first and second metal layers possess a spin Hall angle greater than or equal to 1%.

In an embodiment of the method, the magnetic insulator layer comprises a magnetic insulator material selected from the group consisting of yttrium aluminum garnet (YIG) and rare earth iron garnets (ReIG). In further embodiments, one or both of the first and second metal layers may be formed from antiferromagnetic materials.

In an embodiment of the method, the magnetic insulator layer comprises a rare earth iron garnet selected from europium iron garnet (EuIG) and lutetium iron garnet (LuIG).

In an embodiment of the method, the substrate comprises a material selected from the group consisting of gadolinium gallium garnet (GGG; $Gd_3Ga_5O_{12}$), yttrium aluminum garnet (YAG; $Y_3Al_5O_{15}$), strontium titanium oxide (STO; $SrTiO_3$), neodymium gallium garnet (NGG; $Nd_3Ga_5O_{12}$), and silicon (Si).

In an embodiment of the method, a root mean squared (RMS) roughness of the substrate is approximately 10% or less than the thickness of the first or second metal layer formed thereon.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

FIGS. 12a-12d are plots illustrating the field dependence of nonlocal voltage and local MR signals in an embodiment of a Pt/YIG/Pt spin current device of the present disclosure; (a) measured nonlocal voltage as a function of magnetic field; (b) relative change of nonlocal voltage signal with respect to $V_{nl}$ (0 mA) as a function of magnetic field; (c) local resistivity for the second metal layer as a function of magnetic field; (d) local MR for the second metal layer as a function of magnetic field;

FIGS. 16a-16c are AFM micrographs of a YIG thin film grown on GGG(110)/Pt (5 nm); (a)-(c) 2 μm×2 μm AFM scans of GGG(110) substrate, GGG(110)/Pt(5 nm), and GGG/Pt(5 nm)/YIG(40 nm), respectively;

FIGS. 16d-16e are RHEED patterns of as-grown (d) and annealed (e) GGG(110)/Pt (5 nm)/YIG(40 nm);

FIGS. 19(a)-19(d) illustrate SMR and longitudinal SSE of GGG(110)/Pt(5 nm)/YIG(40 nm). (a) Illustrations of measurement geometry of SMR, where a, b, and c are angles between H and y, z, and z, axes, respectively and the magnitude of H is 2000 Oe, 1 T, and 1 T for a-, b-, and c-scans, respectively. (b) Angular dependence of SMR ratios for three measurement geometries at 300 K; (c) The sample structure and measurement geometry of longitudinal SSE, where the heater current I is 50 mA and H is applied along the y direction; All the thicknesses are denoted in nanometers (nm); (d) Field dependence of room temperature SSE signal, which is normalized by the heating power P and detecting length L.

DETAILED DESCRIPTION

Figure 1:
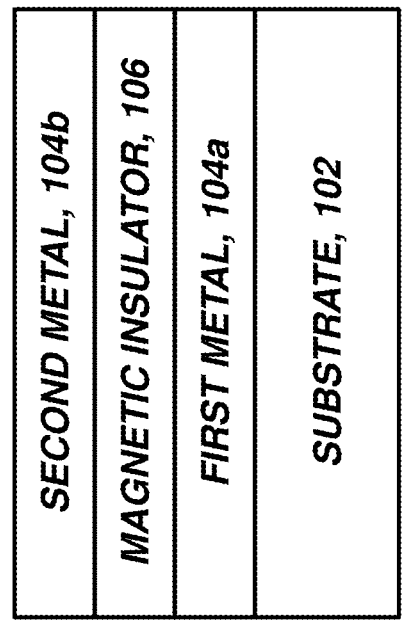
FIG. 1 is a schematic illustration of an embodiment of a spin current valve device of the present disclosure.

Pure spin current, a flow of spin without flow of any companying net change, is commonly generated in two ways. A first method of generating pure spin current makes use of the Spin Hall effect [1-7] in normal metals (NM) with strong spin-orbit coupling, such as platinum (Pt) and tantalum (Ta). Pure spin currents generated by this first method are also referred to as electronic spin currents. A second method of generating pure spin currents utilizes the collective motion of magnetic moments [8-11] or spin waves with the quasi-particle excitations called magnons [12-14]. Pure spin currents generated by this second method are also referred to as magnonic spin currents. A popular material used for generation of magnonic spin currents is yttrium iron garnet (YIG), a magnetic insulator (MI).

There has been significant research interest in pure spin current transport in both conducting and insulating materials. Whether by spin pumping [15-18], the spin Seebeck effect [19-22], or the spin Hall and inverse spin Hall effects (SHE/ISHE) [1-7], pure spin current generation and detection are typically accomplished in bilayers including a magnetic and non-magnetic layer [16-18]. Generation of pure spin currents or detection of pure spin currents, but rarely both, is performed electrically. For example, Kajiwara, et al. [23] first demonstrated a lateral, all-electrical device in which an electrical signal can transmit through YIG over a macroscopic distance (e.g., approximately 1 mm). The response, approximately 1 nV, is highly non-linear with a threshold in the driving current, which has been interpreted as the critical value for the spin transfer torque [24, 25] induced coherent precession of YIG magnetization. The effect also suggests that electronic and magnonic spin currents are interconvertible at the metal/magnetic insulator interface. However, to date, this phenomenon has not been reproduced in a similar plane geometry.

Zhang, et al. [13, 14] have predicted a phenomenon with a different origin in sandwich structures, analogous to the conventional spin valve device for spin-polarized charge currents [26, 27]. Rather than exciting a coherent precession of magnetization at one interface, electrons in the NM create/annihilate magnons in the MI. The individual magnon creation/annihilation does not need to overcome any threshold. Therefore, the interconversion between electronic and magnonic spin currents takes place at any spin current. Due to the long magnon decay length in MI [28], this effect couples two remote electrical currents, referred to as the magnon mediated drag current. Furthermore, the "on" and "off" states of the sandwich structure are controlled by the relative orientation between the polarization of the spin current and the MI magnetization. In small lateral devices, similar to that of Kajiwara's, Cornelissen, et al. [29] have reported both ω- and 2ω non-local current responses in alternating current (AC) measurements. The ω-response indicates a linear, non-local current relation that does not appear to share the same origin as that of the effect reported by Kajiwara.

Embodiments of the disclosure present devices utilizing pure spin currents and methods of making and using the same. For example, novel sandwich devices including layers of NM/MI/NM are illustrated in which electrical and magnonic spin currents are interconvertible across interfaces between the NM and MI layers. The combined effects allow transmitting an electrical signal across the MI, predicated as the magnon-mediated current drag phenomenon [13-14]. As discussed in greater detail below in the Examples, it is observed that the spin current can be switched "on" or "off" by controlling the magnetization orientation of the MI, analogous to conventional spin valves for spin-polarized charge current. The transmitted current drag signal scales linearly with the driving current without a threshold and follows the power-law with n ranging from 1.5 to 2.5. These results indicate that the NM/MI/NM sandwich structure can serve as a scalable pure spin current valve device which is an important component in spintronics.

FIG. 1 presents a schematic illustration of an embodiment of a pure spin valve device 100 of the present disclosure. The device 100 includes a first metal layer 104a, a magnetic insulator layer 106 overlying the first metal layer 104a, and a second metal layer 104b overlying the magnetic insulator layer 106. A substrate 102 underlies the first metal layer 104a.

Figure 2:
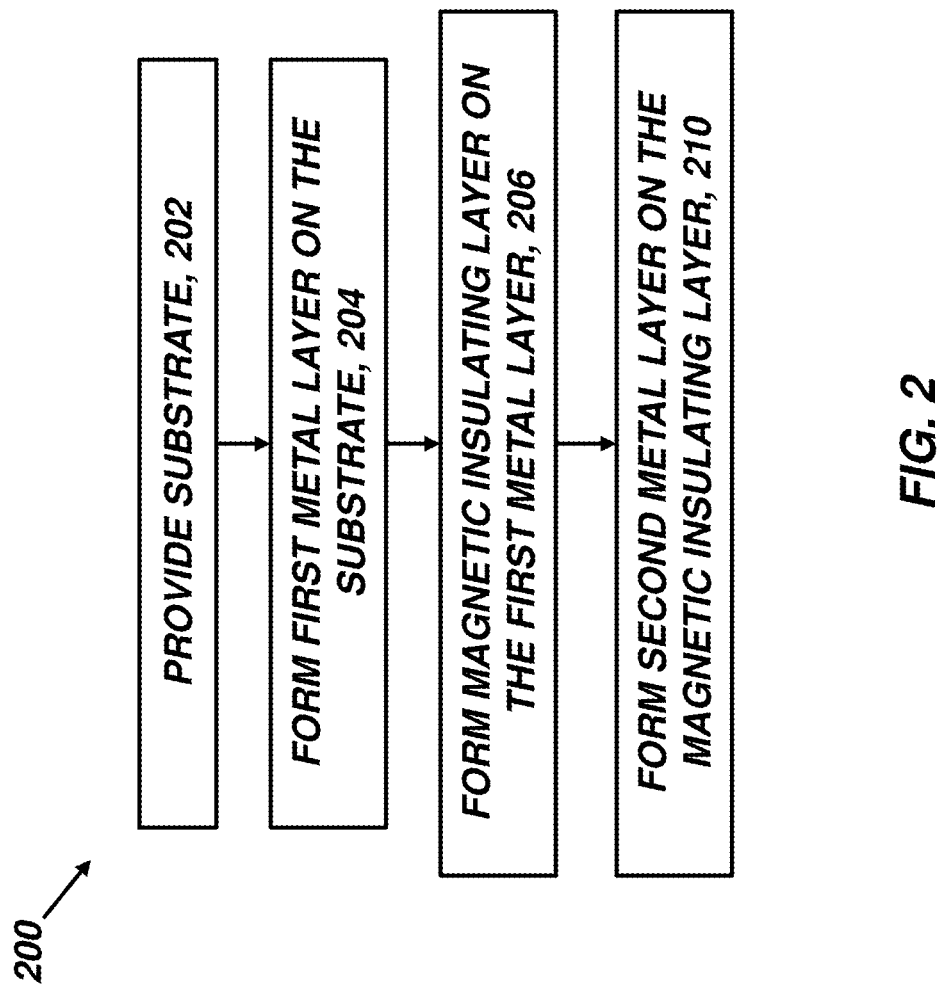
FIG. 2 is a flow diagram illustrating an embodiment of a method for fabricating the spin current valve device of FIG. 1.

A flow diagram illustrating an embodiment of a method 200 for forming the pure spin valve device 100 is shown in FIG. 2. It may be understood that, in alternative embodiments, the method 200 may include greater or fewer operations and that the operations may be performed in an order different than that illustrated in FIG. 2.

In operation 202, the substrate 102 is provided. Embodiments of the substrate 102 may be formed from a single crystal materials having a lattice constant similar to that of the first metal layer 104a. Examples of suitable substrate materials may include, but are not limited to, garnets (e.g., rare earth garnets). In further embodiments, garnets suitable for the substrate 102 are non-magnetic (e.g., non-iron containing). In certain embodiments garnets possessing a slightly larger or smaller lattice constant as the first metal layer 104a may be employed to engineer interface strain, such as tensile or compressive strain, which controls the magnetic easy axis direction in the magnetic insulator layer 106. Examples of rare earth garnets may include, but are not limited to, gadolinium gallium garnet (GGG; $Gd_3Ga_5O_{12}$) yttrium aluminum garnet (YAG; $Y_3Al_5O_{15}$), neodymium gallium garnet (NGG; $Nd_3Ga_5O_{12}$), and other garnets. In a further embodiment, the substrate 106 is formed from a non-garnet material, such as strontium titanium oxide (STO; $SrTiO_3$) or silicon (Si). The single crystal substrate 102 may possess a crystal orientation of (110), (111), etc.

In operation 204 of the method 200, the first metal layer 104a is formed upon the substrate 102. Suitable techniques for forming of the first metal layer 104a may include, but are not limited to, sputtering (e.g., dc magnetron sputtering), pulsed laser deposition (PLD), and electron-beam evaporation. Deposition may be performed within a sealed chamber containing a selected gas at a selected gas pressure upon the substrate 102 or in a vacuum at a selected temperature to achieve a selected deposition rate. For example, sputtering deposition may be performed as follows. The gas may be argon at a pressure selected from the range of about 1 mTorr to about 5 mTorr. The substrate temperature may be maintained at approximately room temperature. The deposition rate may be selected from the range of about 0.5 Å/s to about 2 Å/s.

Embodiments of the first metal layer 104a may be formed from heavy metals possessing strong spin-orbit coupling. In further embodiments, the first metal layer 104a may be formed from heavy metals possessing strong spin-orbit coupling and low resistivity. For example, the first metal layer 104a may exhibit a spin Hall angle greater than or equal to a selected value, where larger spin angles are preferred because the spin Hall angle is determined by the strength of the spin-orbit coupling. In an embodiment, the first metal layer 104a may exhibit a spin Hall angle greater than or equal to 1%. Low resistivity may include resisitivities less than or equal to 200 μΩ·cm. In certain embodiments, the resistivity of the first metal layer 104a is less than or equal to 50 μΩ·cm. In further embodiments, the resistivity of the first metal layer 104a is less than or equal to 20 μΩ·cm. In other embodiments, the resistivity of the first metal layer 104a is less than or equal to 15 μΩ·cm. In additional embodiments, the resistivity of the first metal layer 104a is less than or equal to 10 μΩ·cm. For example embodiments of the first metal layer 104a may be selected from metals including, but not limited to, platinum (Pt), tantalum (Ta), tungsten (W), bismuth (B), and alloys thereof. In other embodiments, the first metal layer 104a may be formed from a plurality of layers.

The thickness of the first metal layer 104a may be provided as follows. The lower thickness limit of first metal layer 104a may be determined by its surface roughness and continuity. The upper limit of first metal layer 104a may be determined, at least in part, by the spin current diffusion length, which is the length scale over which the spin current decays to zero. In an embodiment, the thickness of the first metal layer 104a may be selected from the range of about 2 nm to about 10 nm. In further embodiments, the thickness of the first metal layer 104a may be selected from the range of about 2 nm to about 5 nm. In an embodiment, the thickness the first metal layer 104a is about 5 nm.

In operation 206, the magnetic insulator layer 106 is deposited upon the first metal layer 104a. Suitable techniques for forming the magnetic insulator layer 106 may include, but are not limited to, pulsed laser deposition (PLD) and sputtering. Deposition of the magnetic insulator layer 106 may be performed within a sealed chamber containing a selected gas at a selected gas pressure and temperature to achieve a selected deposition rate. The gas may be one or more of oxygen and ozone. The gas pressure may be selected from the range of about 1 mTorr to about 5 mTorr. The deposition temperature may be selected from the range of about 450° C. to about 850° C. The deposition rate may be selected from the range of about 1 Å/min to about 5 Å/min.

Embodiments of the magnetic insulator layer 106 may be formed from magnetic insulators including, but not limited to, yttrium aluminum garnet (YIG) and other rare-earth iron garnet (ReIG) films. Rare earth metals (Re) may include the lanthanide series (lanthanium (La), cerium (Cs), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yt), lutetium (Lu)), as well as scandium (Sc) and yttrium (Y). Accordingly, embodiments of the magnetic insulator layer 106 may include, but are not limited to, YIG, TmIG, EuIG, GdIG, and LuIG. In further embodiments, the magnetic insulator layer 106 may be antiferromagnetic.

The thickness of the magnetic insulator layer 106 may be provided as follows. The lower thickness limit of magnetic insulator layer 106 is set by the magnetic insulating requirement. That is to say, the magnetic insulating layer should be thick enough to ensure magnetic insulation between the first and second metal layers 104a, 104b. The upper thickness limit of the magnetic insulator layer 106 is set by the magnon decay length (approximately 10 μm). In an embodiment, the thickness of the magnetic insulator layer 106 is selected from the range of about 30 nm to about 10 μm. In certain embodiments, the magnetic insulator layer has a thickness of about 80 nm.

The as-grown magnetic insulating layer 106 may be further subjected to a thermal treatment. The purpose of the thermal treatment is to ensure that the magnetic insulator layer (e.g., YIG) is magnetic. Examples of the thermal treatment may include, but are not limited to, rapid thermal annealing (RTA) at a selected temperature and time. In certain embodiments, the thermal treatment temperature may be selected from the range of about 750° C. to about 850° C. and the thermal treatment time may be selected from the range of about 100 s to about 300 s.

Following the thermal treatment, a roughness of the magnetic insulating layer is relatively low in order to ensure the quality of the first metal layer 104a, as the first metal layer 104a is thin (e.g., approximately 2 nm-10 nm; approximately 2 nm-5 nm, etc.). In an embodiment, a root mean squared (RMS) roughness of the magnetic insulating layer 106 is approximately 10% or less than the thickness of the first metal layer. For example, the RMS roughness of the magnetic insulating layer 106 may be selected within the range of about 0.1 nm to about 1 nm, within the range of about 0.1 nm to about 0.5 nm, etc.

In certain embodiments, the magnetic insulator layer 106 may be formed from single crystal films possessing texture (e.g., RMS roughness) as discussed above. In alternative embodiments, the magnetic insulator layer 106 may be formed from polycrystalline films possessing texture (e.g., RMS roughness) as discussed above. Polycrystalline films may be advantageous, as they can be produced at lower cost compared to single crystal films and may reduce the lattice matching requirement, facilitating the use of materials such as STO, for example, for back gating or Si/SiO$_2$ for back gating.

In operation 210, the second metal layer 104b is formed upon the magnetic insulator layer 106. The conditions under which the second metal layer 104b is formed may be the same as those described above for the first metal layer 104b. Embodiments of the second metal layer 104b may be selected from metals including, but not limited to, platinum (Pt), tantalum (Ta), bismuth (Bi), tungsten (W), and alloys thereof. The thickness of the second metal layer 104b may be selected from the range of about 2 nm to about 10 nm. In an embodiment, the thickness the second metal layer 104b is about 5 nm.

In an embodiment, the first and second metal layers may each be formed from the same material (e.g., Pt). In alternative embodiments, the first metal layer 104a and the second metal layer 104b may be formed from different materials (e.g., the first metal layer 104a may be formed from Pt and the second metal layer may be formed from Ta).

Figure 3:
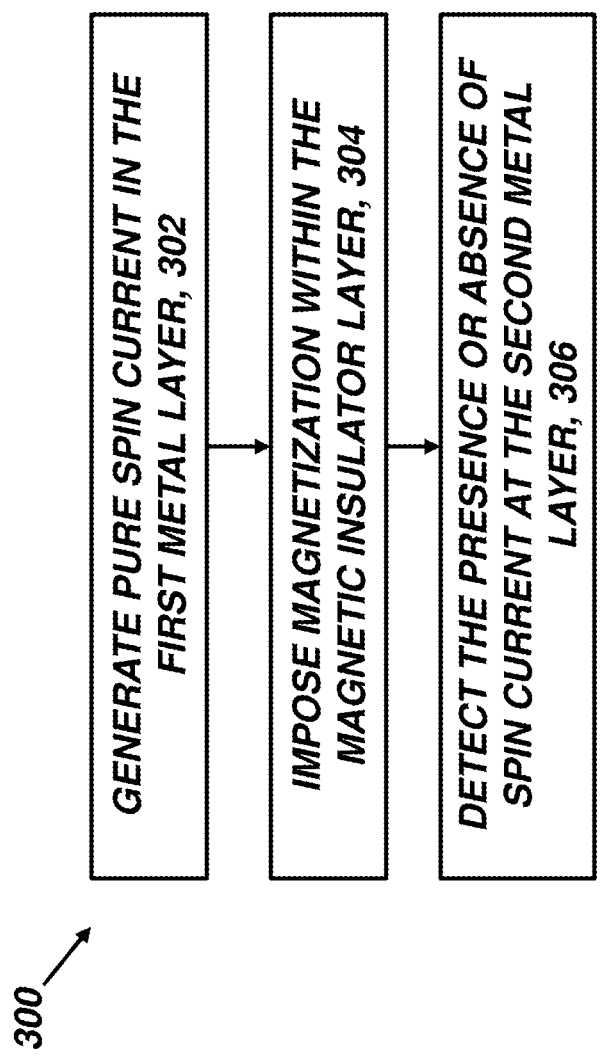
FIG. 3 is a flow diagram illustrating an embodiment of a method for operating the spin current valve device of FIG. 1.
Figure 4A:
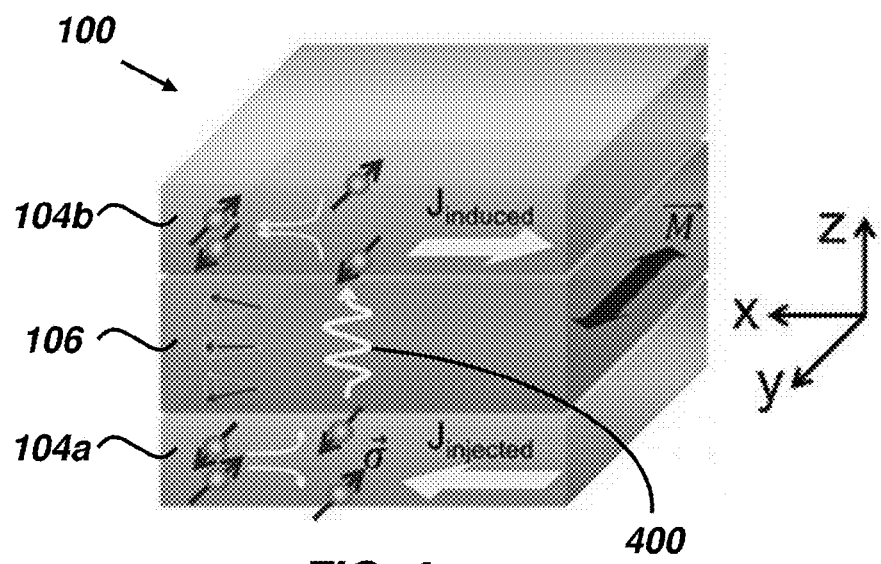
FIGS. 4a-4b are perspective views illustrating an embodiment of a spin current valve of the present disclosure; (a) the spin current valve in an "on" state; (b) the spin current valve in an "off" state.
Figure 4B:
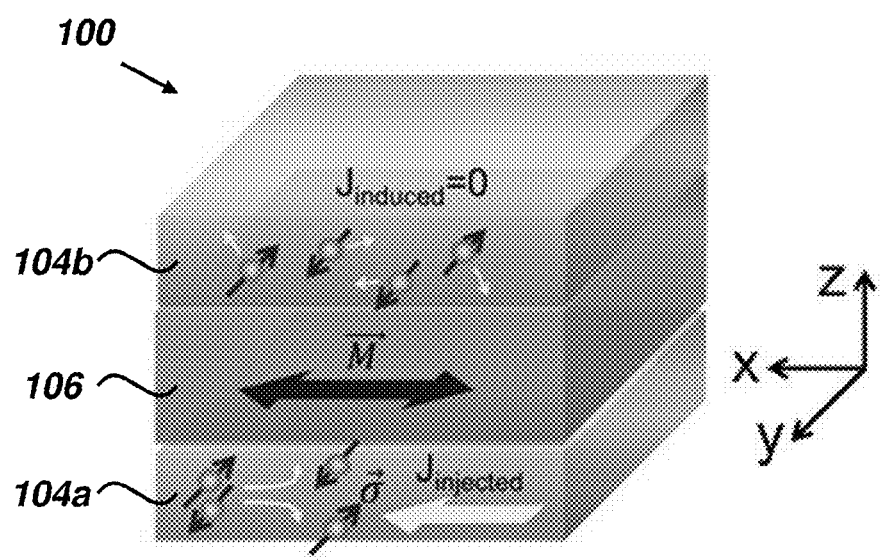

The discussion now turns to FIG. 3, which presents a flow diagram illustrating a method 300 of operating the spin valve device 100 in conjunction with FIGS. 4a-4b including operations 302-306. It may be understood that, in alternative embodiments, the method 300 may include greater or fewer operations and that the operations may be performed in an order different than that illustrated in FIG. 3.

The pure spin valve device 100 is oriented with each of the layers 102, 104a, 106, and 104b lying approximately parallel to a selected plane. For illustrative purposes, assume the layers 102, 104a, 104b, 106 extend approximately parallel to the x-y plane and are stacked in the z-direction. In operation 302, a pure spin current is generated within the first metal layer 104a. For example, the pure spin current may be generated via the spin Hall effect (SHE) by injection of a charge current ($J_{injected}$) into the first metal layer 104a.

As illustrated in FIGS. 4a-4b, in the "Hall" geometry, injection of the charge current in a first direction generates a pure spin current 400 flowing in a second, orthogonal direction with a spin polarization ($\vec{\sigma}$) oriented parallel to a third direction, orthogonal to the first and second directions. That is to say, the pure spin current 400 does not flow along the same direction as the charge current because the fundamental mechanism is the Hall effect. For example, assuming the direction of the injected electrical current is the x-direction, the spin polarization is oriented in the y-direction (within the plane of the first metal layer in which the electrical current is injected, e.g., 104a) and the pure spin current 400 travels in the z-direction.

It may be understood, however, that embodiments of the device 100 may be configured for operation under conditions where the electrical current is injected in other directions within the first metal layer 104a. For example, if the electrical current flows in the x-direction and the spin polarization in oriented in the z-direction, then the spin current is oriented in the y-direction. Under these circumstances, the device 100 may be configured such that the first metal layer 104a, the magnetic insulator layer 106, and the second metal layer 104b contact each other in the direction of the spin current (e.g., the y-direction).

In operation 304 of the method 300, a magnetization of the magnetic insulator layer 106 is generated in the plane of the magnetic insulator layer 106 and oriented at a selected direction. When $\vec{M}$ is collinear with $\vec{\sigma}$ (FIG. 4a), magnons are created or annihilated depending on whether $\vec{M}$ is parallel or anti-parallel to $\vec{\sigma}$. For example, an external field may be applied using an electromagnet or a superconducting magnet. In further embodiments, where the device 100 is fabricated on a chip, it is envisioned that the magnetic field can be generated by a current line.

Without being bound by theory, it is believed that the conduction electrons in the first metal layer 104a interact with the localized magnetic moments of the magnetic insulator layer 106 via the s-d exchange interaction at their interface, resulting in the creation of magnons ($\vec{M}$ parallel to $\vec{\sigma}$) or annihilation of magnons ($\vec{M}$ anti-parallel to $\vec{\sigma}$) in the magnetic insulator layer 106, accompanied by spin-flips of conduction electrons in the first metal layer 104a. Due to the nature of the s-d interaction [12-14], i.e., $H_{sd} = -J_{sd}\Sigma\vec{\sigma}\cdot\vec{M}$, where $J_{sd}$ is exchange coupling strength and $\vec{M}$ is the magnetization of the magnetic insulator layer 106. As such, the interaction creates a non-equilibrium magnon population that extends to the interface between the magnetic insulator layer 106 and the second metal layer 104b and drives magnon diffusion. This diffusion further drives spin accumulation in the magnetic insulator layer 106 and the second metal layer 104b. The excess/deficit magnons are then converted to a spin current in the second metal layer 104b by the reverse process, which is converted to an induced charge current ($J_{induced}$) again in the second metal layer 104b via the inverse spin Hall Effect (ISHE).

In contrast, when $\vec{M}$ is perpendicular with $\vec{\sigma}$ (FIG. 4b), there is no non-equilibrium magnon population or spin accumulation in the magnetic insulator layer 106 and the pure spin current generated in the first metal layer 104a is absorbed by the magnetic insulator layer 106. Consequently, there is no spin accumulation at the interface between the magnetic insulator layer 106 and the second metal layer 104b and no induced charge current in the second metal layer 104b.

Accordingly, the magnon creation/annihilation process may be switched "on" or "off" by controlling the relative orientation between $\vec{M}$ and $\vec{\sigma}$. Conceptually, this allows the pure spin valve device 100 to control the flow of spin current through the device 100, from the first metal layer 104a to the second metal layer 104b. By measuring the induced charge current at the second metal layer 104b in operation 306 of the method 300, the presence or absence of pure spin current propagation through the device 100 may be detected.

Figure 5:
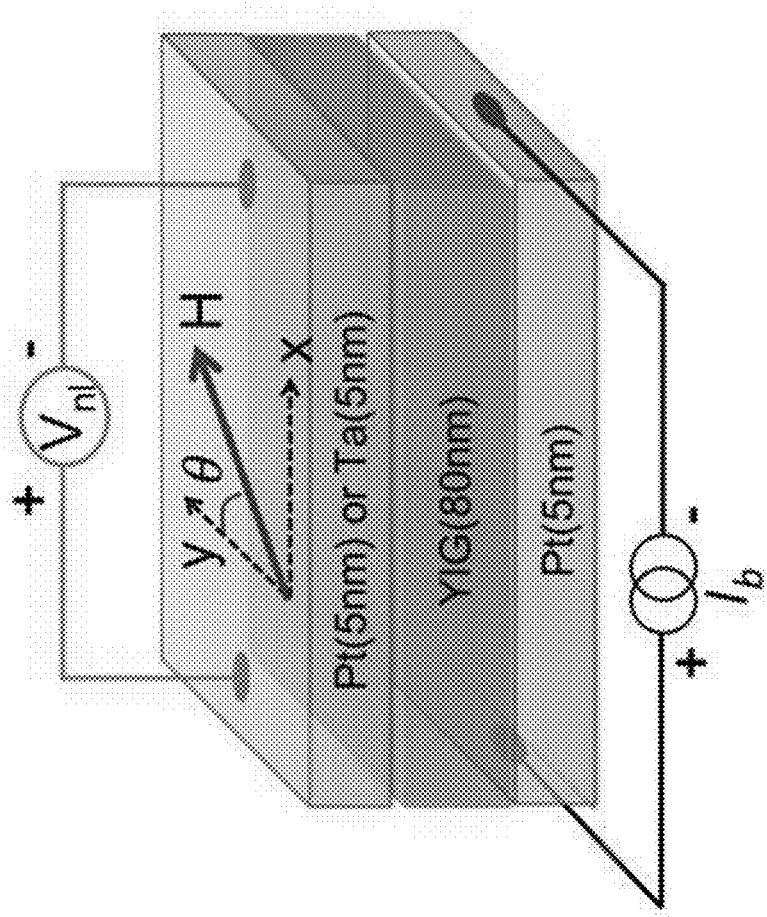
FIG. 5 is a schematic illustration of an experimental setup for measuring field-dependent non local signal in an embodiment of a spin current valve device of FIG. 1.

An embodiment of the pure spin current device 100 formed from Pt (5 nm)/YIG (80 nm)/Pt or Ta (5 nm) is illustrated in FIG. 5 and discussed in greater detail below in the Examples. The first Pt metal layer 104a is used to inject current, while the second metal layer 104b, either Pt or Ta, functions as a detector to measure the induced current or the nonlocal voltage $V_{nl}$ along the $I_b$ direction (x-direction). An in-plane magnetic field, H, is either swept in a fixed direction or rotated with a continuously varying angle θ with the y-axis which is in-plane and perpendicular to the $I_b$ direction.

In alternative embodiments, the role of the first and second layers 104a may be reversed. For example, the second metal layer 104a may be used to inject current, while the first metal layer 104b, may function as a detector to measure the induced current or the nonlocal voltage $V_{nl}$ along the $I_b$ direction (x-direction). An in-plane magnetic field, H, is either swept in a fixed direction or rotated with a continuously varying angle θ with the y-axis which is in-plane and perpendicular to the $I_b$ direction.

EXAMPLES

Further examples of the pure spin valve device 100, including fabrication, characterization, and operation, are described below. As illustrated and discussed below, the magnon mediated current drag in NM/MI/NM sandwich structures is established by investigating the field-, angle-, current-, and temperature-dependencies of the nonlocal signal $V_{nl}$. For all transport measurements, current was fed to the pure spin valve device 100 using a Keithley 2400 dc current source and the voltage was measured by a Keithly 2182 nano-voltmeter. The field dependence measurements were carried out using a closed cycle system, while the angular dependence measurements were performed by a physical property measurement (PPMS) system equipped with a rotary sample holder. For the nonlocal measurements, the excitation current in the first metal layer 104a was typically no more than 2 mA. For the local magnetoresistance measurements, the current applied in the second metal layers 104b was 1 μA, while the current used in the first metal layer 104a was 10 μA.

Spin Valve Device Fabrication

Two different pure spin valve devices were fabricated for evaluation. Three reference samples of the first pure spin valve device were formed from first and second metal layers of Pt and a magnetic insulator layer of YIG. The first and second metal layers each possessed a thickness of 5 nm and the magnetic insulator layer possessed a thickness of 80 nm, Pt (5 nm)/YIG (80 nm)/Pt (5 nm). Two reference samples of a second pure spin valve device were formed from a first metal layer of Pt, a second metal layer of Ta, and a magnetic insulator layer of YIG, Pt (5 nm)/YIG (80 nm)/Ta (5 nm).

The purpose of fabricating these two devices is to evaluate whether current leakage in one metal layer could produce a nonlocal response through the local magnetoresistance effect in the other metal layer. This effect in embodiments of the pure spin current devices 100 is shown to be small from the parallel resistor argument. However, to completely validate the mechanism, embodiments of the pure spin current device 100 employing a first metal layer 104 formed from Pt and a second metal layer 104b formed from Ta (beta-phase) have been evaluated. If there were a leakage effect, the local magnetoresistance would give rise to a response with the same polarity since the current direction in the bottom layer is kept the same. The only difference is in the material of the second metal layer 104b. However, Pt and Ta have opposite signs in the spin Hall effect characterized by the spin Hall angle. One is positive and the other is negative, so that the effect, if is due to the pure spin current, changes the sign (from the inverse spin Hall effect characterized by the same spin Hall angle).

A Hall bar was first defined in a photoresist layer deposited on a (110)-oriented single crystal GGG substrate using photolithography. The Hall bar includes a channel in which the current flows, and along the channel, there are orthogonal lines to the channel from which the voltages between any two lines, along the channel or perpendicular to the channel, can be measured. In this geometry, the dimensions of the channel length, width, and separation between them are all well-defined so that the measurements can be done with accuracy. The Hall bar was defined with a channel width of 20 μm and a length of 300 μm between two voltage electrodes. The first metal layer 104a was selected to be Pt and deposited on the open Hall bar area by dc magnetron sputtering. During sputtering, argon pressure was 5 mTorr, the substrate temperature was kept at 300° K., and the dc sputtering power was 37.5 W. The deposition rate of Pt was 0.77 Å/s and the Pt layer thickness was 5 nm.

A liftoff process was further performed to define the pattern for the first Pt metal layer 104a. A layer of photoresist is spun on GGG, followed by UV exposure and developing. Then the exposed part is removed. Subsequently, the first Pt metal layer 104a was deposited onto the photoresist covered (except for the removed pattern) substrate 106. After deposition, the photoresist was dissolved along with the first Pt metal layer 104a right on top of the remaining photoresist. What remains is the patterned first metal layer 104a in direct contact with the substrate 106.

After liftoff, an 80 nm thick YIG film was deposited at 450° C. in an oxygen ($O_2$) environment under a pressure of 1.5 mTorr by pulsed laser deposition (PLD) to cover the entire surface of the sample.

The as-grown YIG film became crystalized and magnetized after rapid thermal annealing (RTA) at 800° C. for 200 s. The thermal treatment is performed because the YIG is not magnetic if it is not in its crystalline phase. As discussed below, the RHEED pattern shows as-deposited YIG is in amorphous state.

The second metal layer of Pt or Ta was patterned using e-beam lithography, followed by dc magnetron sputtering deposition and lift-off procedures. Prior to deposition of the second metal layers, argon ion milling was performed to remove any polymer residues from the magnetic insulator surface. The deposition conditions for the second metal layers were the same as those for the first metal layer. The second metal layer was patterned in strips 2 μm wide and 70 μm long (Pt) or 60 μm long (Ta).

Magnetic Properties of As-Grown YIG Films on Pt

Figure 6:
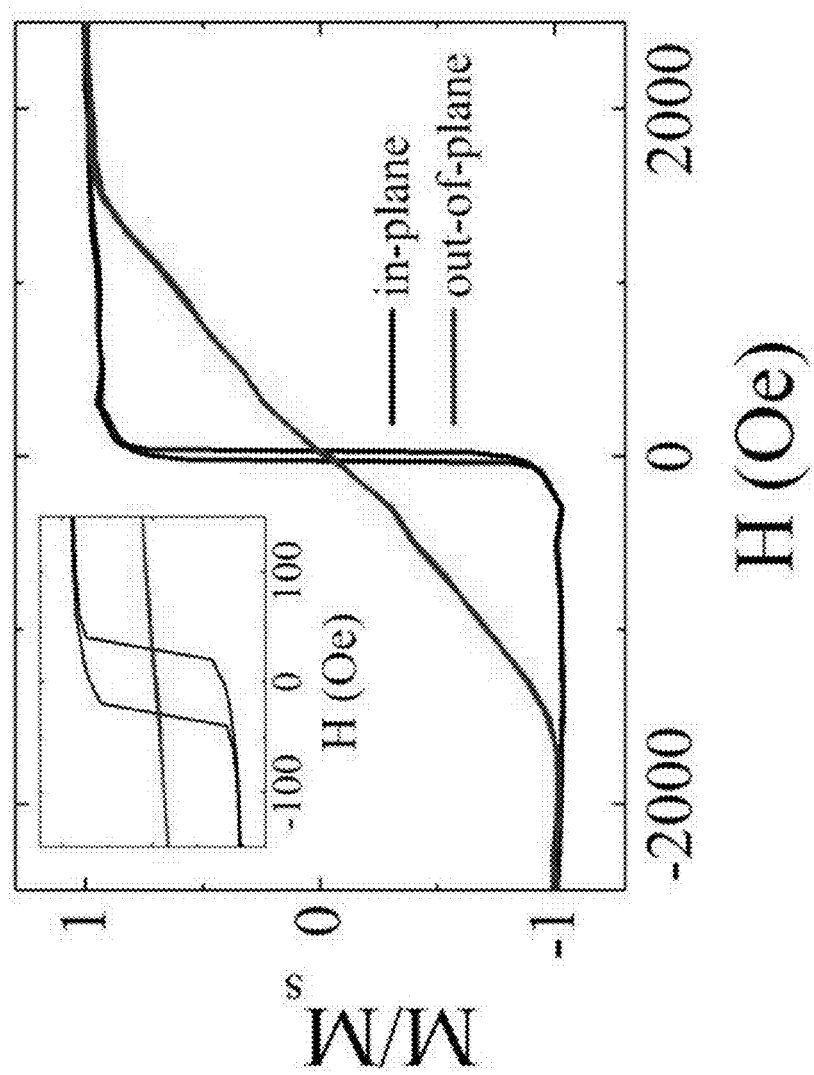
FIG. 6 is a plot of normalized magnetization ($M/M_s$) as a function of applied magnetic field (H) for a uniform GGG/Pt(5 nm)/YIG(80 nm) film measured in-plane and out-of-plane by vibrating sample microscopy (VSM)

The magnetic properties of YIG grown on GGG by pulsed laser deposition have been well studied in previous works [1-4]. In this investigation, YIG was deposited on 5 nm thick Pt (GGG/Pt(5 nm)/YIG (80 nm)). The purpose of this characterization study was to investigate the interface between the first Pt metal layer 104a and the YIG magnetic insulator layer 106, because it was not clear, a priori, whether the spin current transmission and interconversion across this interface would be suitable for the device 100. After the post-annealing thermal treatment of 800° C. for 200 s, the hysteresis of the sample was measured using a vibrating sample magnetometer (VSM). YIG is magnetized and has in-plane magnetic anisotropy, as shown in FIG. 6. VSM measures magnetic moment as a function of the applied magnetic field, which indicates if the material is magnetic, and if it is, how large is the magnetization (i.e. magnetic moment density) and preferred orientation of the magnetization. The inset of FIG. 6 shows the zoom-in low-field hysteresis loops.

It may be observed from FIG. 6 that, if the out-of-plane magnetic field is removed, the magnetization goes back to zero. This means the magnetization likes to be in the film plane. If an in-plane field is applied, it shows a hysteresis loop. This means that the magnetization likes to be in one direction until a magnetic field in the opposite direction exceeds some threshold (called coercive field).

Characterization of Magnetic Insulator Layer

Figure 7:
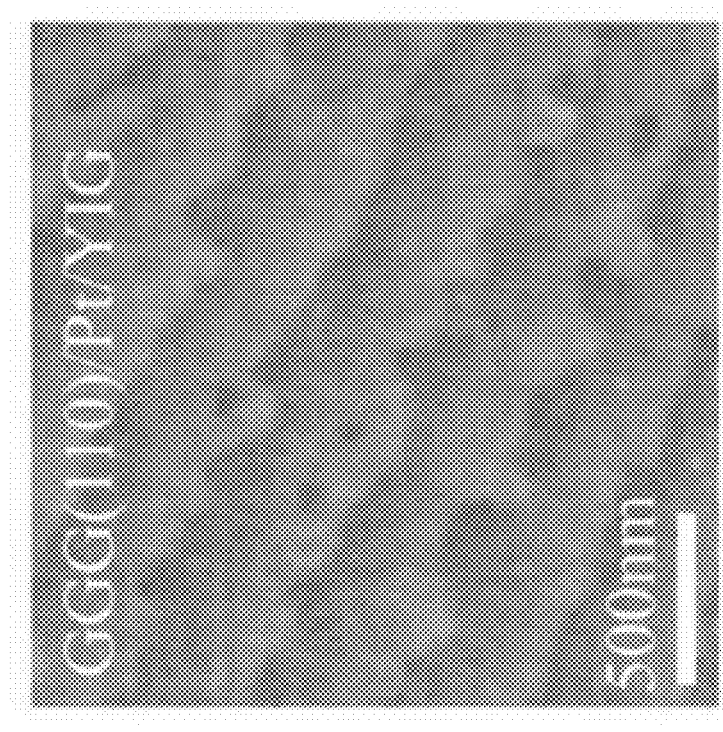
FIG. 7 is an atomic force microscope (AFM) micrograph of a magnetic insulating layer of yttrium iron garnet (YIG) grown on a platinum (Pt) substrate according to embodiments of the present disclosure.

The surface morphology of the magnetic insulator layer grown on 110-GGG and Pt was monitored by atomic force microscopy (AFM); GGG (110)/Pt (5 nm)/YIG (80 nm). The purpose of this characterization study was to investigate the quality of the surface of the YIG magnetic insulator layer, which is important for the second metal layer (not shown). For the sandwich structure, it is desirable have a thin second metal layer 104a overlying the magnetic insulator layer 106. AFM micrographs of the as-grown YIG surface are illustrated in FIG. 7. Clear atomic terraces were observed in the YIG layer, and the root-mean-square (RMS) roughness on terraces was approximately 0.14 nm, indicating a very flat YIG surface. FIG. 7 further illustrates that the morphology of the YIG film tracks the atomically flat terraces of the GGG (110) surface [33] in spite of a layer of Pt in between.

The finding of FIG. 7 is unexpected. Usually, if two materials match in crystal structure, the top material nicely lies on top and takes on the orientation of the bottom material. For example, this is the case for YIG on GGG or between two garnets. However, in the instant example, the YIG magnetic insulator layer is on the first Pt metal layer, with the first Pt metal layer on the GGG substrate. Notably, though, YIG feels the presence of GGG in spite of the intervening first Pt metal layer, tracking the atomically flat terraces of the GGG (110) surface.

Characterization of Metal-Magnetic Insulator Layer Interface

The interface quality between the metal layer and the magnetic insulator is verified by both spin Seebeck Effect (SSE) [19] and spin Hall magnetoresistance (SMR) [34, 35] measurements.

(a) Spin Hall Magnetoresistance (SMR) Measurements

Spin Hall magnetoresistance is a unique transport phenomenon in the first and second metal layers which is in direct contact with a magnetic insulator layer [1, 2, 5-9]. A charge current flowing in the first metal layer with strong spin-orbit coupling is converted to a spin current via the spin Hall effect. The reflection and absorption of this spin current at the interface of the first metal layer/magnetic insulator layer depends on the orientation of the magnetization ($\vec{M}$) of the magnetic insulator. When M is collinear to the spin polarization, most of the spin current is reflected back; in contrast, when M is perpendicular to the spin polarization of the spin current ($\vec{M} \perp \sigma$), most of the spin current is absorbed by the magnetic insulator. This behaves as a dissipation channel. Therefore, the resistance of the metal layer is larger than that for $\vec{M} \| \sigma$. As a result, the degree of refection or absorption of the spin current at the normal metal/magnetic insulator interface can be monitored by SMR. In order to characterize the quality of the interface in the spin valve device, MR measurements are performed.

Figure 8A:
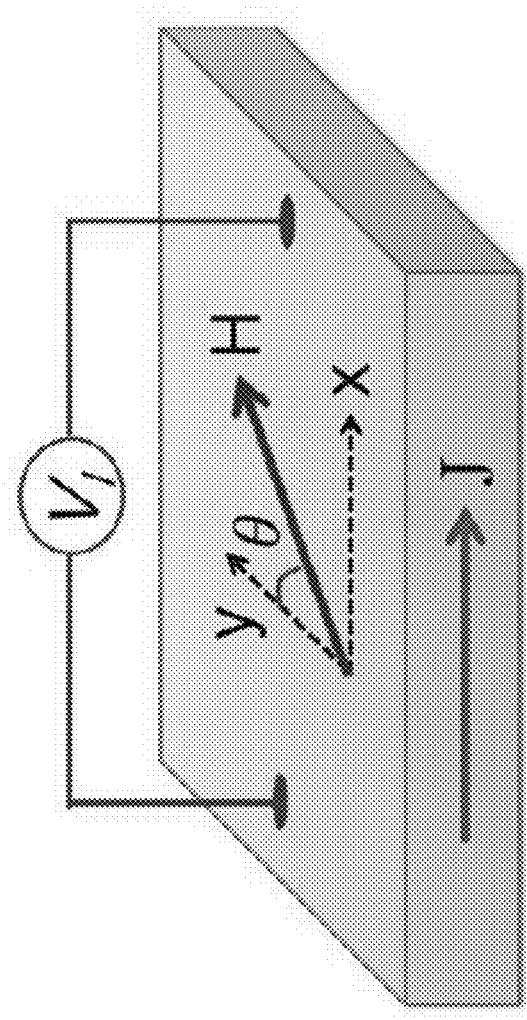
FIG. 8a is a schematic illustration of local magnetoresistance (MR) geometry.

As illustrated in FIG. 8a, local MR measurements were performed by applying a magnetic field (1000 Oe) in the film plane at an angle with the y-axis, while the current flows along the x-axis. The angular dependence of the MR ratios for the second Pt metal layer, the second Ta metal layer, and the first Pt metal layer at room temperature are summarized in FIG. 8b.

According to the SMR theory [S6], the longitudinal resistivity is given by Equation 1:

$$\rho = \rho_o + \rho_1 m_y^2 \qquad (1)$$

where $\rho_o$ is a constant insensitive to the magnetization orientation, $\rho_1$ represents the SMR magnitude which depends on film thickness, spin Hall angle and spin diffusion length of the metal layer and spin-mixing interface conductance, and $m_y$ is the y component of the magnetization unit vector. From the solid curves in FIG. 8b, it is observed that the experimental data can be well described by Equation 1.

Besides the SMR, the induced magnetization in the top metal layer due to the magnetic proximity effect (MPE) [S10-S12] can also generate similar MR. The MPE induced MR should increase monotonically with decreasing temperature [S 12], since the induced magnetic moment enhances at low temperatures. However, the SMR has a broad peak as a function of temperature [S2]. This result distinguishes SMR from the other magnetoresistance arising due the magnetized metal interface layer according to the proximity effect. If SMR plays a significant role, then a peak in some temperature range where the spin diffusion length is comparable with the thickness of the metal layer is expected.

Figure 8C:
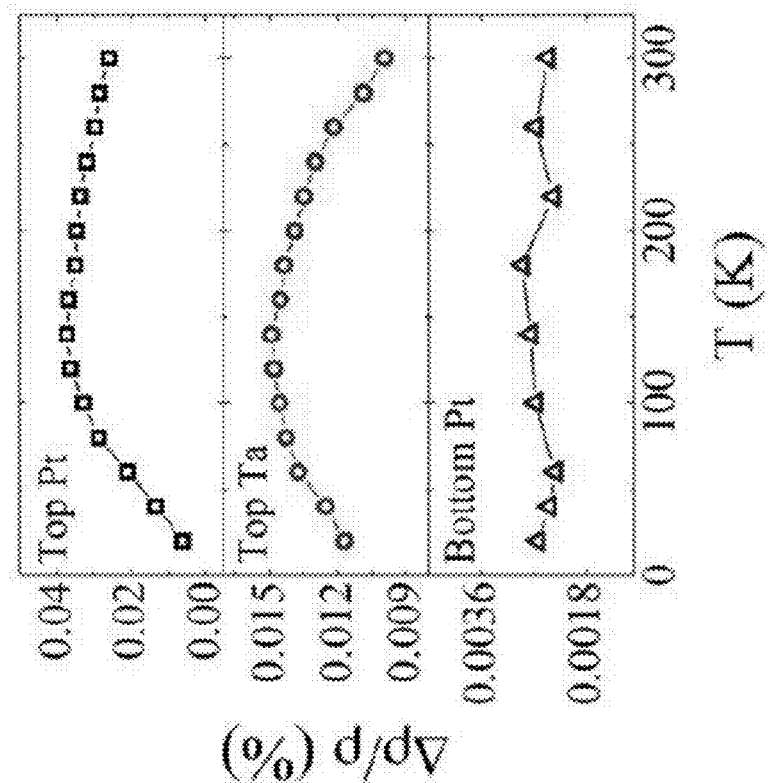
FIGS. 8b and 8c are plots of room temperature angular dependence and temperature dependence of the MR in a first Pt metal layer, a second Pt metal layer, and a second Ta metal layer for an embodiment of the spin current valve device of FIG. 1.
Figure 8B:
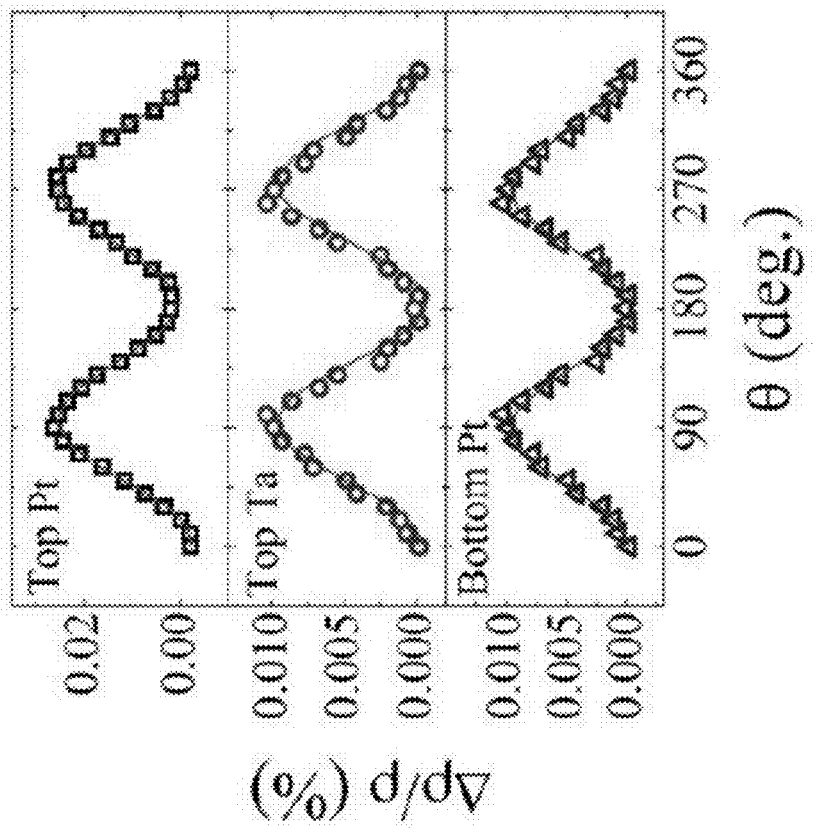

To better understand the nature of the MR, observation and verification of the SMR mechanism, temperature dependent measurements were performed and the results are summarized in FIG. 8c. Remarkably, for second metal layers of both Pt and Ta, the MR ratio have a broad peak, as expected from the SMR theory, suggesting the SMR mechanism dominates the transport property of the second metal layer. It is noted, however, that the MR ratio of the bottom Pt is one order smaller than that of the top Pt and is insensitive to temperature. Recently, Goennenwein, et al. reported a monotonically decreasing SMR signal with decreasing temperature [S13]. Those results indicate that the temperature dependence of SMR is very sensitive to the interface quality. The lack of clear temperature dependence of SMR in the first Pt metal layer here can be attributed to the less ideal quality of the metal/magnetic insulator interface, possibly due to oxidation occurred in rapid thermal annealing (RTA) at high temperatures. Based on the temperature dependence of the MR results, these observations demonstrate that the SMR mechanism dominates in embodiments of the disclosed spin current devices, and the anisotropic reflection and absorption of the spin current at the metal/magnetic insulator interfaces indicate excellent interface quality for spin current interconversion.

(b) Spin Seebeck Effect Measurements

Figure 9A:
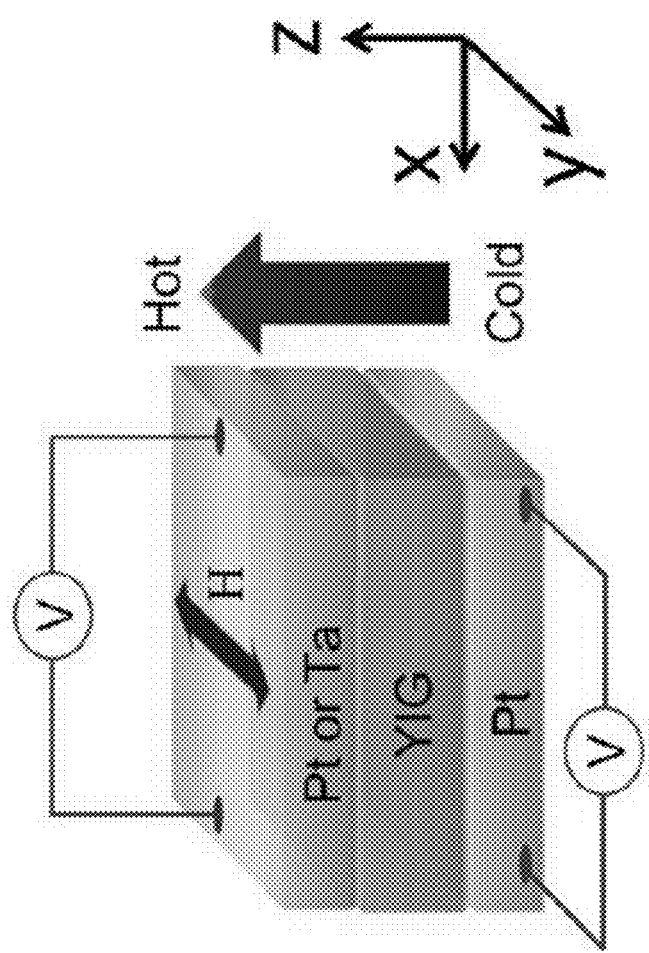
FIG. 9a is a schematic illustration of an experimental setup for longitudinal spin Seebeck effect (SSE) measurement.

The transmission of thermally excited spin currents through the NM/YIG interface was confirmed by performing longitudinal spin Seebeck effect measurements in the spin valve device. In order to generate a vertical temperature gradient in separate longitudinal spin Seebeck effect measurements, a 300 nm layer of aluminum oxide ($Al_2O_3$) was deposited to electrically insulate the device. A top heater layer of 5 nm Cr and 50 nm Au was further deposited. When a charge current (30 mA) is applied to the Cr/Au layer, a temperature gradient is established in the z-direction by joule heating, as shown in FIG. 9a.

Figure 9B:
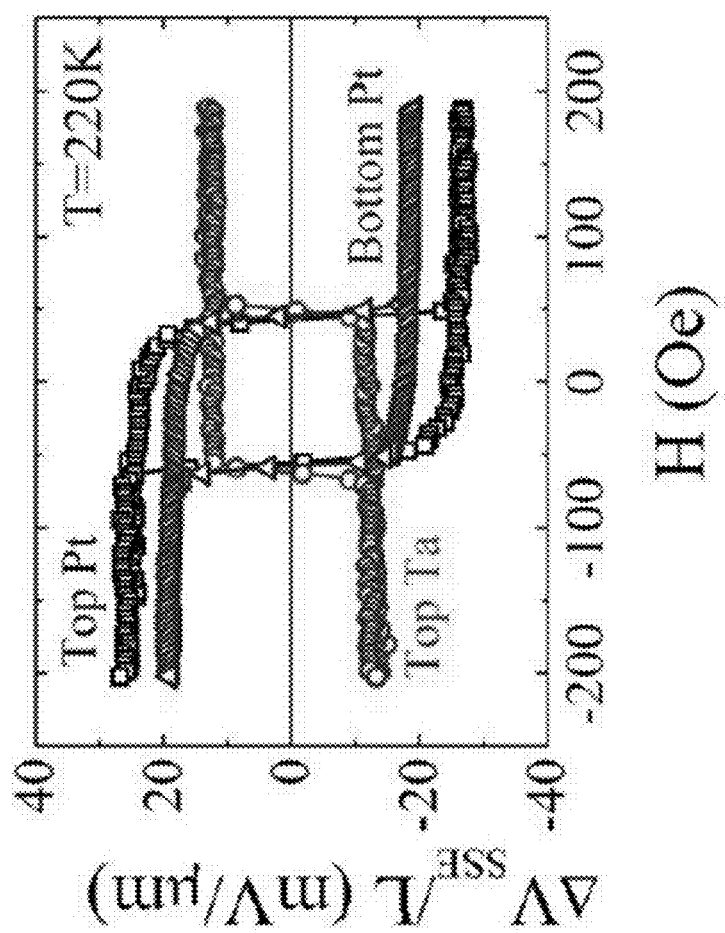
FIG. 9b is a plot of SSE signals ($\Delta V_{SSE}$) normalized to a detecting strip length (L) as function of magnetic field at a temperature of 220K for a first Pt metal layer, a second Pt metal layer, and a second Ta metal layer for an embodiment of the spin current valve device of FIG. 1.

During the SSE measurements, a magnetic field was applied in the y-direction while the voltage is detected along the x-direction. In FIG. 9b, the field dependence of the longitudinal spin Seebeck signal at 220K, normalized to the device length, is illustrated. From FIG. 9b, it may be observed that all three metal layers (first Pt metal layer, second Pt metal layer or second Ta metal layer) show strong SSE signals. Second, it is further observed that that the magnitude of the SSE signal from the first Pt metal layer is on the same order as that from the second Pt layer, which is different from the contrast in SMR shown in FIG. 8c. The different behaviors of SMR and SSE indicate that the effect on the anisotropic reflection (or absorption) of a spin current due to the spin transfer torque is very different from that on the transmission of the thermally excited spin current by the same metal/magnetic insulator interface. Third, it is observed that that the SSE signal from the second Ta metal layer shows the opposite sign to that from Pt, which can be accounted for by the fact that Pt and Ta have opposite spin Hall angles. This result can be taken as confirmation of the excellence interface quality for transmitting thermally excited spin currents.

Resistance Between First and Second Metal Layers

Figure 10:
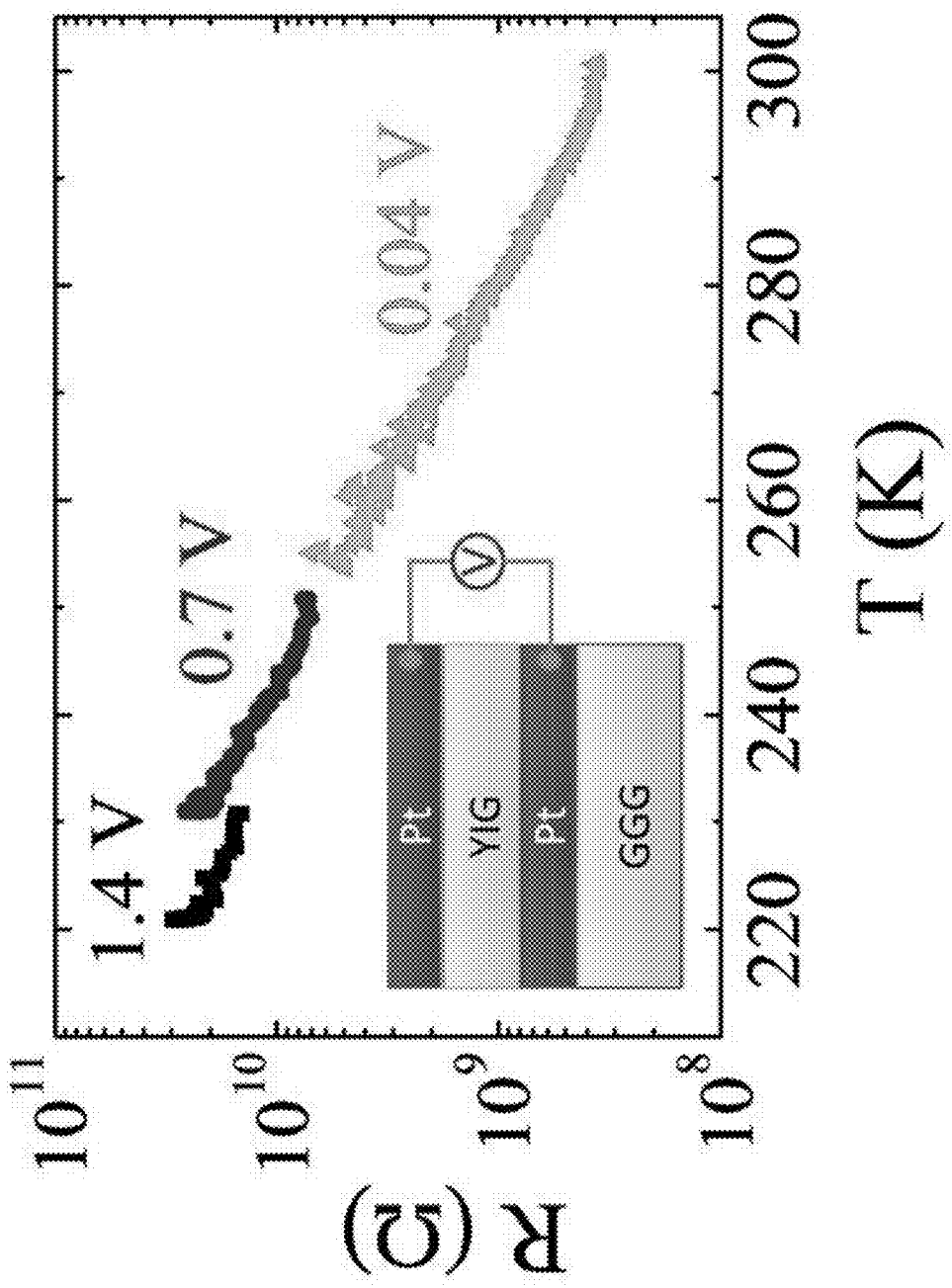
FIG. 10 is a plot of resistance between the first and second metal layers in an embodiment of the spin current valve device of FIG. 1 acquired under bias voltages of 0.04V, 0.07V, and 1.4, applied as shown in the inset.

The resistance between first and second metal layers was further measured. The purpose for these measurements is to characterize the current leakage. Ideally it is desired that the DC resistance is infinite so that no leakage occurs through the YIG magnetic insulator layer. As illustrated in the inset of FIG. 10, the resistance was measured by applying a voltage between the top and bottom metal layers and detecting the leakage current as a function of temperature. The voltage applied is 0.04V, 0.7V and 1.4V from high to low temperatures. The voltage value at a given temperature was adjusted to avoid irreversible damage to the device. From FIG. 10, it may be observed that the junction resistance increases rapidly with decreasing temperature and exceeds 20 G$\Omega$ for T$\leq$200K, which is even larger than the input impedance of the nano-voltmeter (>10 G$\Omega$ for Keithley 2182A), indicating that the shunting current in leakage produces a negligible voltage in the second metal layer via the magnetoresistance during the nonlocal measurements. Since the resistance between the top and bottom NM layers increases exponentially as the temperature decreases, and exceeds 20 G$\Omega$ below 220K, all nonlocal measurements were performed below 220K to avoid any parasitic signal from the small leakage current. In $V_{nl}$, a non-zero background signal that exists even below $I_b$=0 is removed.

Field Dependence of Voltage ($V_{nl}$) At Top Metal Layer

Figure 11B:
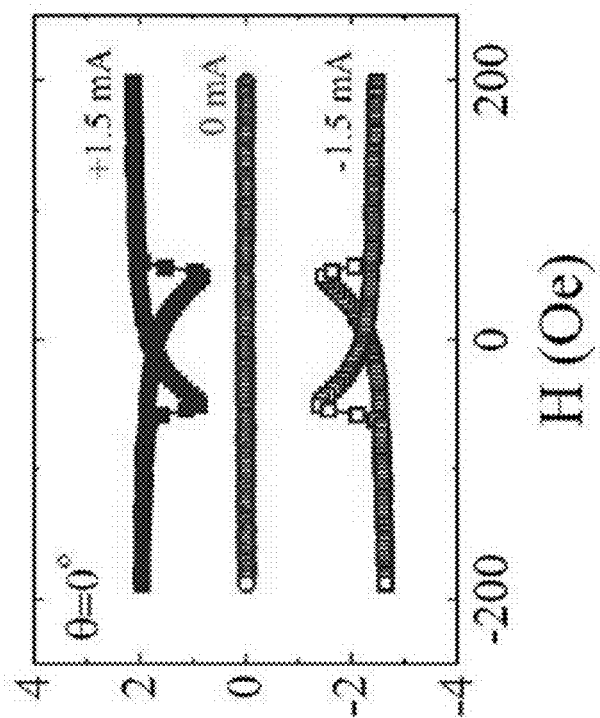
FIGS. 11a and 11b are plots of nonlocal voltage ($V_{nl}$) measured at the second metal layer, in the direction of the injection current ($I_b$), as a function of applied, in-plane magnetic field, (H); (a) $V_{nl}$ measured along the direction aligned with current ($I_b$) applied to the first metal layer, i.e., θ=90°; (a; inset) optical image of GGG/Pt/YIG/Pt spin current valve device; (b) $V_{nl}$ measured along the direction perpendicular to the current ($I_b$) applied to the first metal layer, i.e., θ=0°.
Figure 11A:
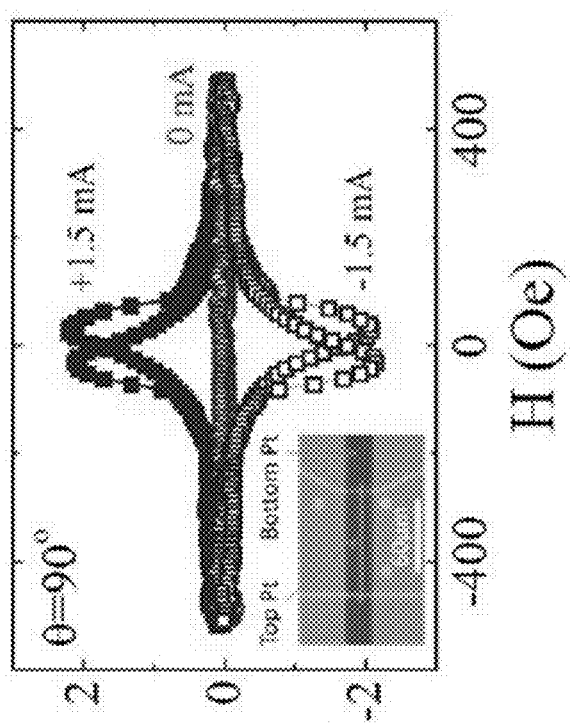

The field dependence of $V_{nl}$ at 220 K is illustrated in FIGS. 11a-11b. When H is swept along $I_b$, i.e. 90°, (FIG. 11a) $V_{nl}$ is a constant at $I_b$=0 (circles). However, at $I_b$=+1.5 mA, $V_{nl}$ shows a clear hysteresis with two positive peaks tracking the coercive fields of the magnetic insulator film, indicating that $V_{nl}$ is closely related to the magnetization state of YIG. As the $I_b$ is reversed, $V_{nl}$ also reverses the sign. In principle, a sign reversal can occur if there is a finite leakage current flowing in the top layer. Through the magnetoresistance, this current can produce a hysteretic voltage signal. Notably, the observed hysteresis in the nonlocal voltage indicates that it depends on the magnetic state of YIG, since YIG has hysteresis as shown in the VSM field-in-plane measurements (it has a hysteresis loop).

Estimating from the leakage current, it is observed that the relative change in $V_{nl}$ due to this effect is at least three orders of magnitude smaller than the observed nonlocal voltage signal, as discussed below. Therefore the leakage current is excluded as the source of the nonlocal signal. It is further observed that $V_{nl}$ (+/−1.5 mA) is the same as $V_{nl}$ (0 mA) at the saturation state (H>200 Oe) when $\vec{\sigma}$ is perpendicular to $\vec{M}$, suggesting magnon creation/annihilation is totally suppressed. For the field sweeps with $\theta$=0° (FIG. 11b), $\vec{\sigma}$ is collinear to $\vec{M}$ at high fields, interface magnon creation/annihilation results in a full current drag signal. Clearly, $V_{nl}$ (+1.5 mA) is different from $V_{nl}$ (0 mA) at the saturation fields and reverses the sign when $I_b$ reverses.

It is further noted that $V_{nl}$ (+/−1.5 mA) differs from $V_{nl}$ (0 mA) at the coercive fields. One would expect them to be the same since the average magnetization should point to the x-direction at the coercive fields, which would correspond to the saturation states for $\theta$=90° in FIG. 11a. This discrepancy can be explained by the multi-domain state of YIG in which the actual is distributed over a range of angles around $\theta$=90°, and the collinear component of turns on the magnon channel and yields a nonzero $V_{nl}$. In order to investigate the phenomenon in the single-domain state, further measurements of angular and current dependence of the nonlocal signal were performed, discussed below.

Nonlocal Signal Versus Local Magnetoresistance

Further measurements were performed to demonstrate that the nonlocal signal observed in the spin valve device cannot be produced by a local SMR voltage due to the leakage current. FIGS. 12a and 12b are raw nonlocal data for injection currents of +1.5 mA, 0 mA, and −1.5 mA in the bottom Pt metal layer and the relative change in nonlocal signal with respect to $V_{nl}$ (0 mA), respectively. FIGS. 12c and 12d are the local resistivity and the MR ratio for the top Pt metal layer.

FIGS. 12a, 12c illustrate the field dependence of the raw nonlocal signal in the Pt/YIG/Pt device and that of the resistivity in the second Pt layer, respectively. For the nonlocal signal, $V_{nl}$ at zero injection current is constant, which defines a reference. $V_{nl}$ at +1.5 mA (−1.5 mA) shows the clear a hysteresis behavior and attains the minimum (maximum) values around the coercivity field of YIG. The relative change of the nonlocal signal, $$\left(\frac{V(I)-V(0)}{|V(0)|}\right)_{nl} = \left(\frac{\Delta V}{V}\right)_{nl},$$

is shown in FIG. 12b, where V(0) is the nonlocal signal in the absence of the bottom current. In contrast, the MR ratio of the second Pt metal layer in the same device in FIG. 12d. Remarkably, the magnitude of $$\left(\frac{\Delta V}{V}\right)_{nl}$$

at 1.5 mA (~20%) is almost four orders larger than that of the MR ratio in the top Pt layer (~0.02%).

Figure 13C:
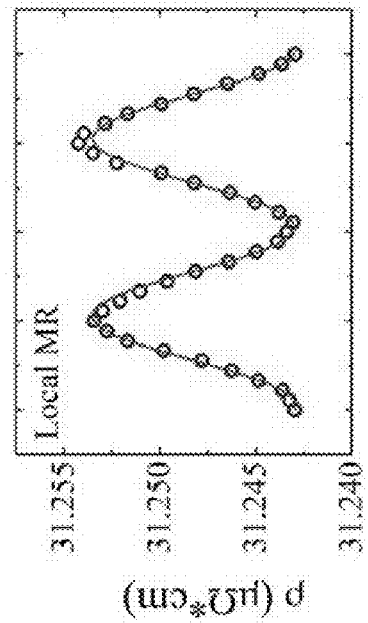
FIGS. 13a-13d are plots illustrating the angular dependence of nonlocal voltage and local MR signals in an embodiment of a Pt/YIG/Pt spin current device of the present disclosure; (a) measured nonlocal voltage as a function of angle; (b) relative change of nonlocal voltage signal with respect to $V_{nl}$ (0 mA) as a function of angle; (c) local resistivity for the second metal layer as a function of angle; (d) local MR for the second metal layer as a function of angle.
Figure 13D:
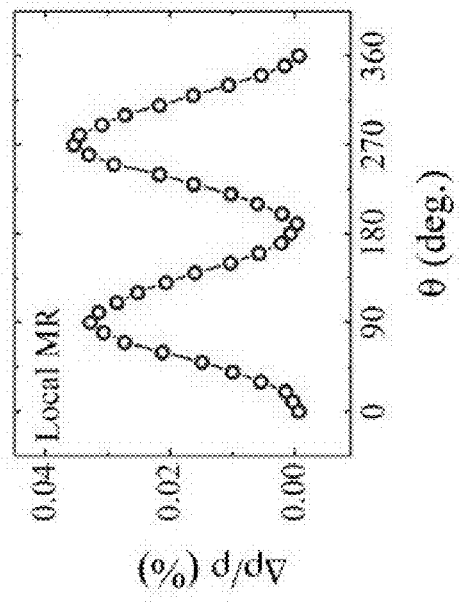
Figure 13A:
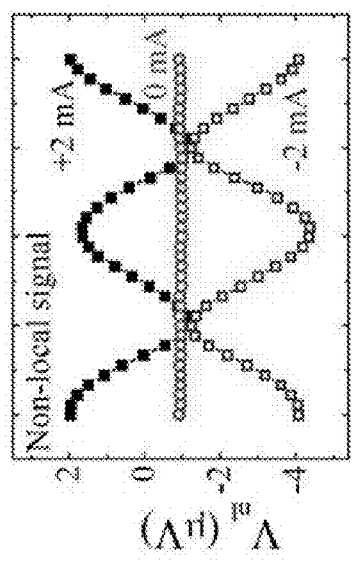
Figure 13B:
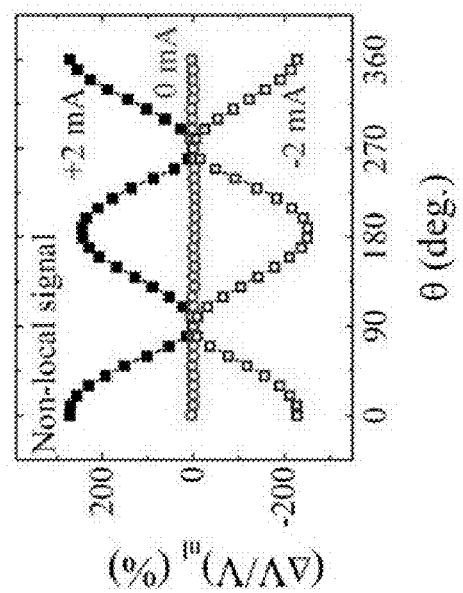

FIG. 13a-13d present plots of the angular dependence of nonlocal and local MR signals in the Pt/YIG/Pt device at 220K. FIGS. 13a and 13b are the raw nonlocal signal and the relative change in nonlocal signal with respect to $V_{nl}$, respectively. FIGS. 13c and 13d are the local resistivity and the MR ratio of the second Ta metal layer. The solid curve in FIG. 13c is the results from fitting Equation 1.

A similar conclusion as above also be obtained from the angular dependence of both the nonlocal signal and local MR in the top Pt layer. The $$\left(\frac{\Delta V}{V}\right)_{nl}$$

at 2.0 mA (~240%) is almost five order larger than MR ratio in the top Pt (~0.03%). The above comparison between the nonlocal voltage signal and the local MR signal in the top Pt strongly suggests that the nonlocal signal cannot be accounted for by the SMR effect in the top layer due to the leakage current.

Angular and Current Dependence of Nonlocal Signal

The angular and current dependence of the nonlocal signal in embodiments of the spin current valve at different injection currents in the first metal layer have been further investigated. FIG. 14a presents $V_{nl}$ in GGG/Pt/YIG/Pt as a function of θ between $\vec{M}$ and $\vec{\sigma}$ at 220 K, as illustrated in FIG. 5. The applied magnetic field (1000 Oe) is sufficiently strong to set YIG into a well-defined single-domain state and to rotate its $\vec{M}$ with it. For all positive $I_b$ (solid symbols), $V_{nl}$ exhibits maxima at θ=0° and 180° ($\vec{M}$ collinear with $\vec{\sigma}$), but minima at θ=90° and 2700 ($\vec{M}$ perpendicular to $\vec{\sigma}$). $V_{nl}$ changes the sign as $I_b$ is reversed (empty symbols). At θ=90° and θ=270°, the nonlocal signal for ±$I_b$ coincides with $V_{nl}$ (0 mA), further validating that the spin current is in the "off" state when $\vec{M}$ is perpendicular to $\vec{\sigma}$.

Figure 15C:
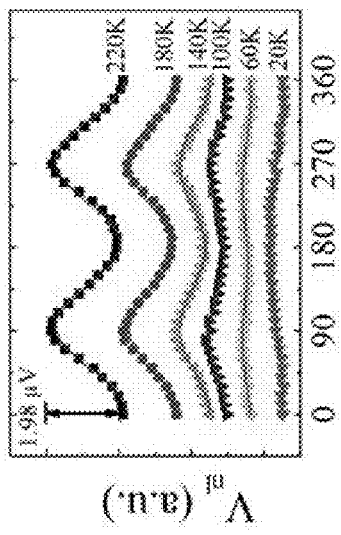
FIGS. 15a-15d are plots illustrating the temperature dependence of the nonlocal voltage signals in spin current devices of the present disclosure; (a) measured nonlocal voltage at different temperatures as a function of angle in a GGG/Pt/YIG/Pt spin current device; (b) temperature dependence of the extracted current drag signal ($V_{Drag}$) and spin current Seebeck signal ($V_{SSE}$) as a function of temperature, inset, in a GGG/Pt/YIG/Pt spin current device; (c) measured nonlocal voltage at different temperatures as a function of angle in a GGG/Pt/YIG/Ta spin current device; (d) temperature dependence of the current drag signal ($V_{Drag}$) and spin current Seebeck signal ($V_{SSE}$) as a function of temperature, inset, in a GGG/Pt/YIG/Ta spin current device.

Similar angular dependent measurements were also taken on a GGG/Pt/YIG/Ta device and the results are depicted in FIG. 15c. For the same measurement geometry and the same polarity of $I_b$, it is observed find that $V_{nl}$ of GGG/Pt/YIG/Ta has the opposite sign to that of GGG/Pt/YIG/Pt, which is expected from the opposite signs in their spin Hall angle. The $V_{nl}$ sign difference here provides further evidence for the magnon mediated mechanism, as opposed to other extrinsic ones such as leakage.

An interesting feature to note here is that $V_{nl}$ at θ=0° and 180° shows a slight but reproducible difference which is independent of the current polarity but increases with the increasing magnitude of $I_b$. This phenomenon to the SSE contribution since the joule heating in the bottom Pt layer unavoidably generates a small vertical temperature gradient, which in turn launches an upward spin current in YIG entering the top Pt (or Ta) layer. As reverses, so does the spin polarization, which consequently produces two different SSE signal levels between θ=0° and 180°. Combining these two effects, the angular dependence data can be fit to Equation 2:

$$V_{nl}=V_o+V_{SSE}\cos\theta+V_{Drag}\cos^2\theta \quad (2)$$

Where $V_o$ is an offset voltage insensitive to the magnetization orientation, $V_{SSE}$ is the SSE voltage amplitude, and $V_{Drag}$ represents the amplitude of the current drag signal.

Figure 14C:
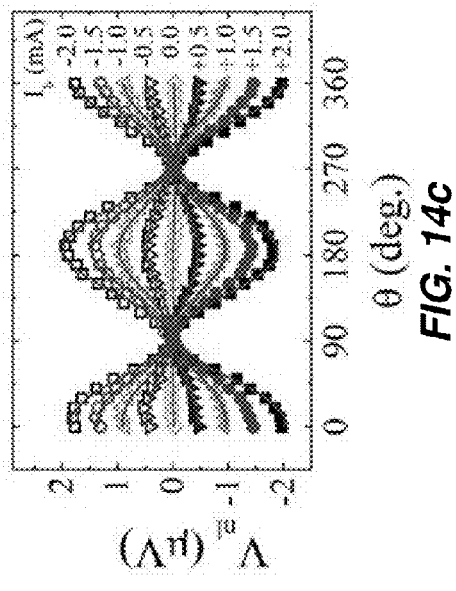
FIGS. 14a-14d are plots illustrating the angular and current dependence of nonlocal voltage signals in the first metal layer in spin current devices of the present disclosure; (a) measured nonlocal voltage as a function of angle in a GGG/Pt/YIG/Pt spin current device; (b) $I_b$-dependence of the current drag signal ($V_{Drag}$) and spin current Seebeck signal ($V_{SSE}$) in a GGG/Pt/YIG/Pt spin current device; (c) measured nonlocal voltage as a function of angle in a GGG/Pt/YIG/Ta spin current device; (d) $I_b$-dependence of the current drag signal ($V_{Drag}$) and spin current Seebeck signal ($V_{SSE}$) in a GGG/Pt/YIG/Ta spin current device.
Figure 14D:
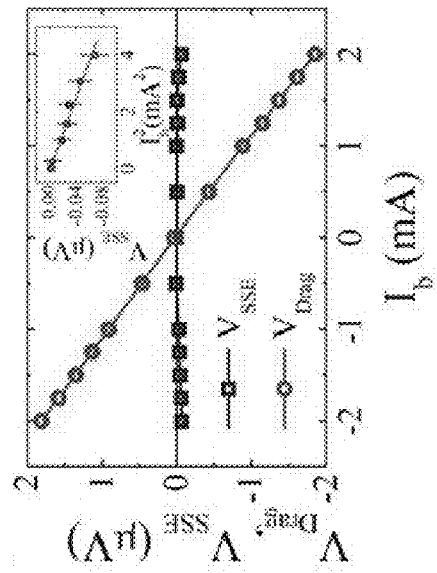
Figure 14A:
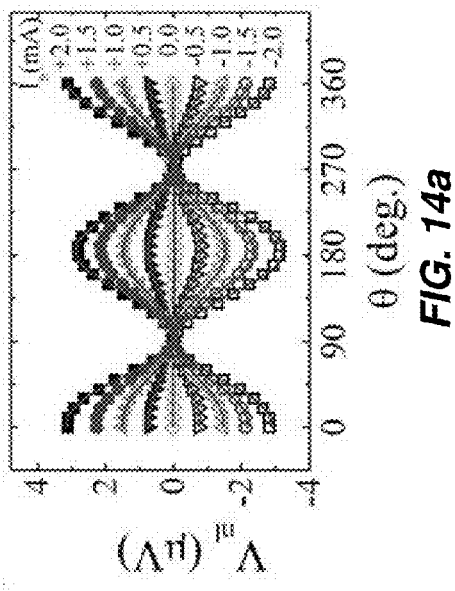
Figure 14B:
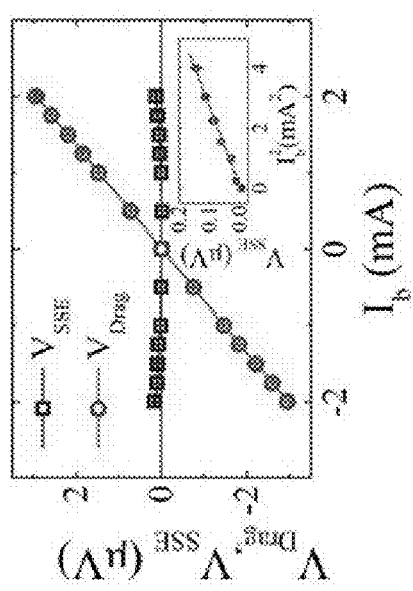

The solid curves in FIGS. 14a and 14c fit the experimental data remarkably well, and the extracted fitting results are plotted in FIGS. 14b and 14d for GGG/Pt/YIG/Pt and GGG/Pt/YIG/Ta devices, respectively. Two conclusions can be drawn from these results. First, the magnitude of the current drag signal (circles) scales linearly with the driving current, i.e., $V_{SSE} \propto I_b^2$, as illustrated in the insets of FIGS. 14b and 14d. This is in contrast with the highly nonlinear behavior observed in [23], where observed threshold behavior was attributed to coherent precession of the magnetization in YIG caused by the spin transfer torque, as discussed above. Second, the weak current dependence of the SSE contribution follows (see the insets of FIGS. 14b and 14d), which is characteristic of thermoelectric effects.

According to Zhang, et al. [14], the temperature dependence of the injection interface spin convertance $G_{em}$ is $$\left(\frac{T}{T_c}\right)^{3/2},$$

where $T_c$ is the Curie temperature of the magnetic insulating layer. For the detection interface, the spin convertance $G_{me}$ is proportional to $$\frac{T}{T_F},$$

where $T_F$ is the Fermi temperature of the metal layer. In the most simplified picture which is strictly applicable only for very thick films, the current drag signal should be proportional to the product of the two spin current convertances, i.e., $G_{em} \propto G_{em} \cdot G_{em} \propto T^{5/2}$.

Figure 15D:
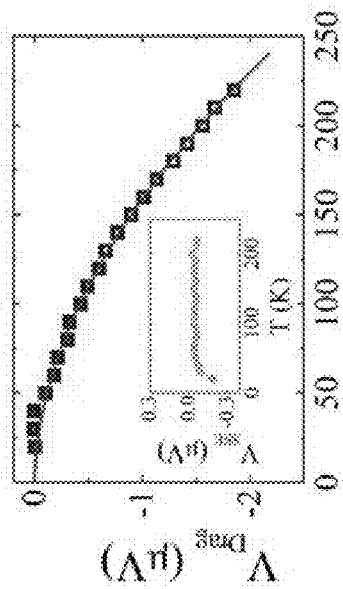
Figure 15A:
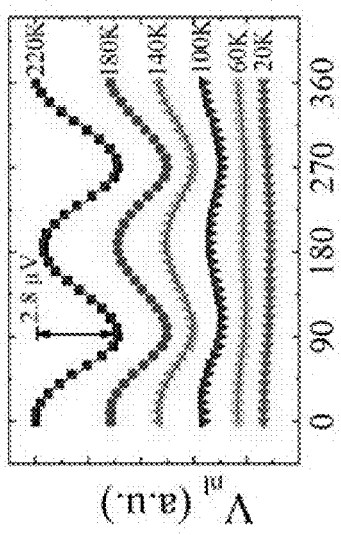

The representative angular dependence measurements below 220K are shown in FIGS. 15a and 15c for GGG/Pt/YIG/Pt and GGG/Pt/YIG/Ta devices, respectively. For both samples, $I_b$ is set at +2 mA and H is held at 1000 Oe. The magnitude of the current drag signal decreases progressively with decreasing temperature for both devices.

Figure 15B:
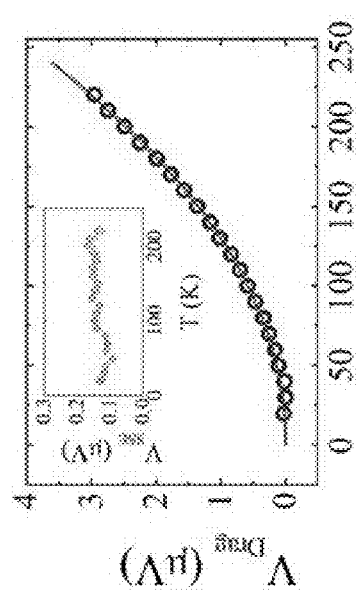

By fitting $V_{nl}$ using Equation (1), the magnitude of $V_{Drag}$ and $V_{SSE}$ can be extracted, shown in FIGS. 15b and 15d. Apart from the expected sign difference, the magnitude of $V_{Drag}$ in both devices monotonically decreases with decreasing temperature. In fact, both data sets can be well fitted by a power-law $V_{Drag}=V_{Drag}°T^n$ (solid curves in FIGS. 15b and 15d), where Drag V is a pre-factor.

The extracted exponent n is 2.21 for GGG/Pt/YIG/Pt and 1.88 for GGG/Pt/YIG/Ta, falling in the range between 1.5 and 2.5. It should be pointed out that the full picture described in [14] contains other quantities that have weak temperature dependence. The deviation of the exponent from 2.5 is fully expected if these factors are considered. On the other hand, the $V_{SSE}$ is found to be relatively insensitive to temperature, suggesting a completely different mechanism.

In summary, the magnon mediated current drag effect in NM/MI/NM sandwich structures has been established by investigating the field-, angle-, current- and temperature-dependences of the nonlocal signal. The spin information carried by conduction electrons and magnons in different materials can be interconverted at the interfaces. Such structures can serve as pure spin current valve devices since rotating the in-plane magnetization of the MI by 90° provides a digital on-off switch of the spin current. Furthermore, such structures also provide analog functionality since rotating the in-plane magnetization of the MI provides analog sinusoidal modulation of the spin current. Due to the extremely low damping in the MI, transmission of the pure spin currents can occur over relatively long distances, providing the functionality of a pure spin interconnect.

Growth of Yttrium Aluminum Garnet Films

High quality bilayers of YIG on metal are very difficult to be fabricated. A main challenge is that the YIG growth requires high temperatures and an oxygen environment [A15], which can cause significant inter-diffusion, oxidation of the metal layer, etc., and consequently lead to poor structural and electrical properties in both metal and YIG layers. Growth of high-quality single crystal YIG thin films is discussed in greater detail below. The YIG films range from about 30 nm to about 80 nm thickness on a 5 nm thick Pt layer atop $Gd_3Ga_5O_{12}$ or GGG (110) substrate. Combined with low-temperature growth, which suppresses the inter-diffusion, subsequent rapid thermal annealing (RTA) and optimization of other growth parameters result in well-defined magnetism, atomically sharp Pt/YIG interface, and atomically flat YIG surface. In addition, despite the intermediate Pt layer that has a drastically different crystal structure from the garnets, the top YIG layer shows desired structural and magnetic properties as if it were epitaxially grown on GGG (110).

5×5 mm² of commercial GGG (110) single crystal substrates are first cleaned in ultrasonic baths of acetone, isopropyl alcohol, then deionized water, and dried by pure nitrogen gun. Subsequently, the substrates are annealed in a furnace at 900° C. in $O_2$ for 8 h which produces atomically flat surface. Atomic force microscopy (AFM) is performed to track the surface morphology of the annealed substrates. FIG. 16a shows the 2×2 µm² AFM scan of an annealed GGG (110) substrate. Flat atomic terraces are clearly present and separated with a step height of 4.46±0.2 Å, which is equal to ¼ of the face diagonal of the GGG unit cell or the (220) interplanar distances of 4.4 Å° of GGG. The 4.4 Å distance is the separation between the $GaO_6$ octahedral layers parallel to (110) that might be defining the observed atomic step ledges. The root-mean-square (RMS) roughness on the terraces is approximately 0.74 Å. Then, the substrate is transferred into a sputtering chamber with a base pressure of $5 \times 10^{-8}$ Torr for Pt deposition. DC magnetron sputtering is used with the Ar pressure of 5 mTorr and power of 37.5 W. The sputtering deposition rate is 0.76 Å/s, and sample holder rotation speed is 10 rpm. After the 5 nm thick Pt deposition, the surface of the Pt film is found to maintain the atomic terraces of the GGG (110) substrate, except that the RMS roughness on the Pt terraces is increased to 1.05 A, as shown in FIG. 16b. It is rather surprising that the 5 nm thick Pt layer does not smear out the terraces separated by atomic distances given that the sputtering deposition is not particularly directional.

Strikingly, terraces are still present even in 20 nm thick Pt (not shown). The substrates are then put in a PLD chamber which has a base pressure of $4 \times 10^{-7}$ Torr, and are slowly heated to 450° C. in high-purity oxygen with the pressure of 1.5 mTorr with 12 wt. % of ozone. The krypton fluoride (KrF) coherent excimer laser ($\lambda$=248 nm, 25 ns/pulse) used for deposition has a pulse energy of 165 mJ/pulse, and repetition rate of 1 Hz. The deposition rate of approximately 1.16 Å/min is achieved with a target to substrate distance of 6 cm. After deposition, the YIG films are ex situ annealed at 850° C. for 200 s using rapid thermal annealing (RTA) under a steady flow of pure oxygen. After RTA, the surface morphology is examined by AFM again. FIG. 16c shows the atomically terraced surface of a 40 nm thick YIG film with RMS of 1.24 Å on the terrace. In this study, the thickness of YIG ranges from 30 to 80 nm and all samples exhibit clear atomic terraces. Even though YIG is annealed at such a high temperature, with the short annealing time, the flat and smooth YIG surface is maintained.

To track the structural properties of YIG, reflection high energy electron diffraction (RHEED) is employed to characterize the YIG surface at every step of the process. FIG. 16d shows the RHEED pattern of the as-grown YIG surface. It clearly indicates the absence of any crystalline order. After the ex situ RTA, the sample is introduced back to the PLD chamber for RHEED measurements again. A streaky and sharp RHEED pattern is recovered as displayed in FIG. 16e which suggests a highly crystalline order. This result is particularly interesting since it shows the characteristic RHEED pattern of YIG grown on GGG. [A10]

Figure 17A:
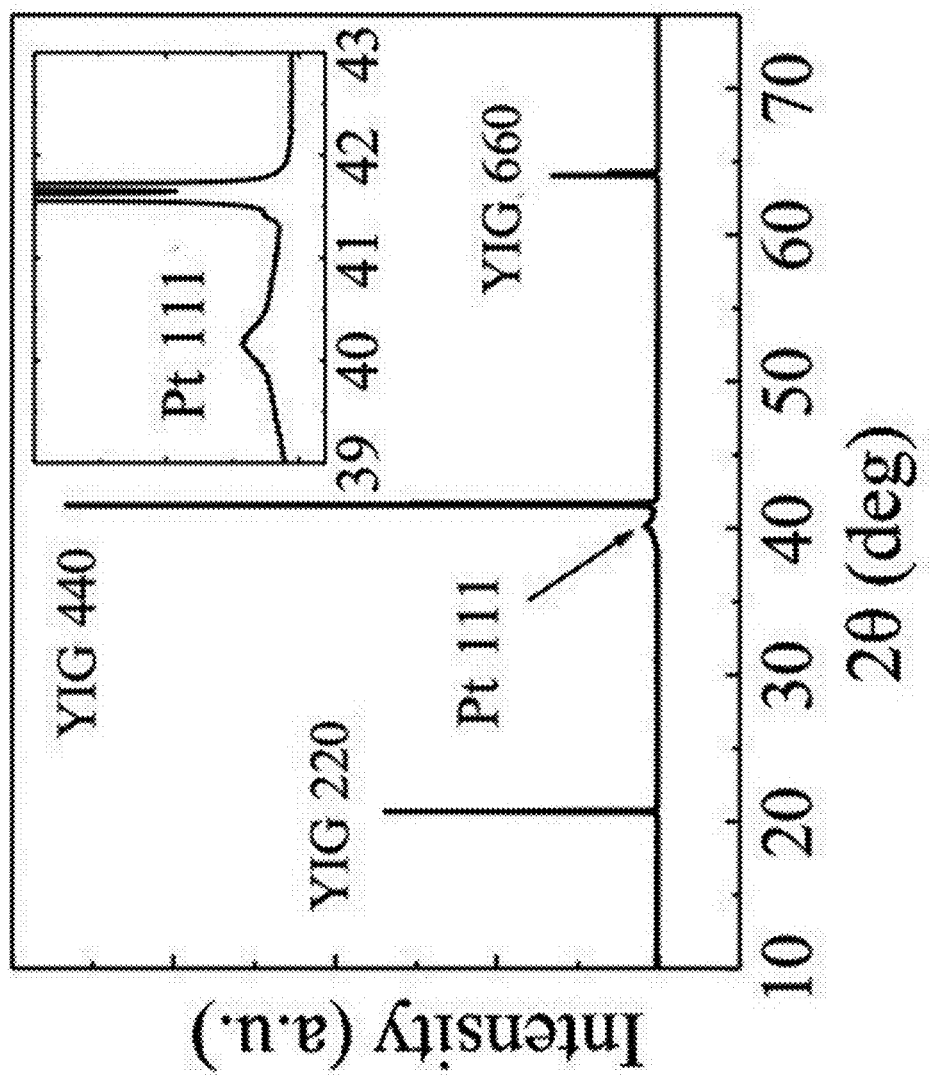
FIG. 17a is an X-ray diffraction (XRD) spectrum of YIG film (40 nm) grown on GGG(110)/Pt (5 nm); Inset: zoom-in plot of Pt 111 peak (2θ=40.15°)

To further confirm its crystalline structure, x-ray diffraction (XRD) using the Cu $K\alpha_1$ line has been carried out over a wide angle range (2θ from 10° to 90°) on the GGG/Pt/YIG sample discussed in FIG. 17a. Because of the close match in lattice constants between YIG and GGG substrate, weak YIG peaks are completely overlapped with strong peaks of GGG so that they are indistinguishable. Three main Bragg peaks of YIG and GGG are observed: 220, 440, and 660, which suggests the (110) growth orientation of both YIG and GGG. No individual weak YIG peaks can be found. It is striking that the YIG film adopts the crystallographic orientation of GGG despite the intermediate Pt layer. By comparing with the spectra of YIG grown directly on GGG, it is possible to identify a new peak (2θ~40.15°) which is better seen in the zoom-in view in the inset of FIG. 17a. This is determined as the 111 peak of the 5 nm thick Pt film that suggests the (111) texture of the Pt layer. It is not clear whether the (111) texture in the intermediate Pt layer is required for YIG to develop the same crystallographic orientation as that of the GGG substrate.

Figure 17B:
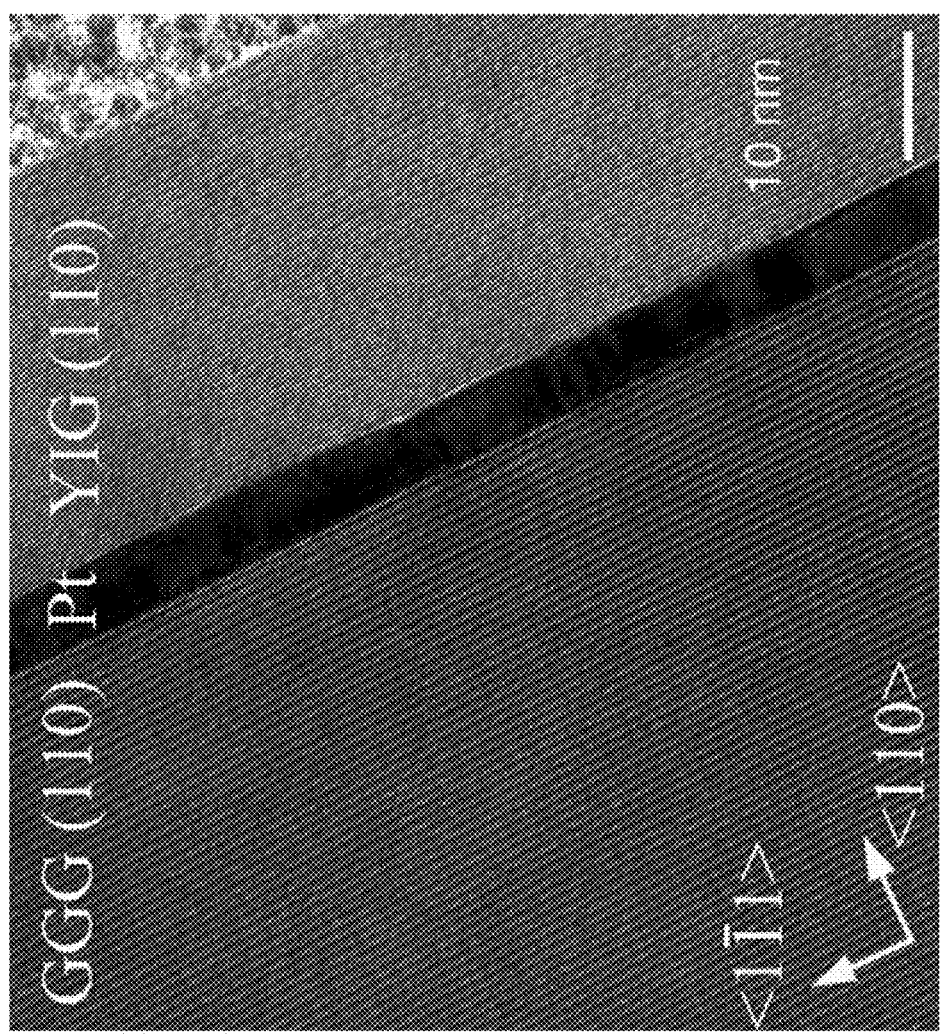
FIG. 17b is a transmission electron microscope (TEM) image of GGG (110)/Pt (5 nm)/YIG (110) (40 nm) heterostructure; The (111) and (110) directions in GGG are shown for reference.
Figure 17C:
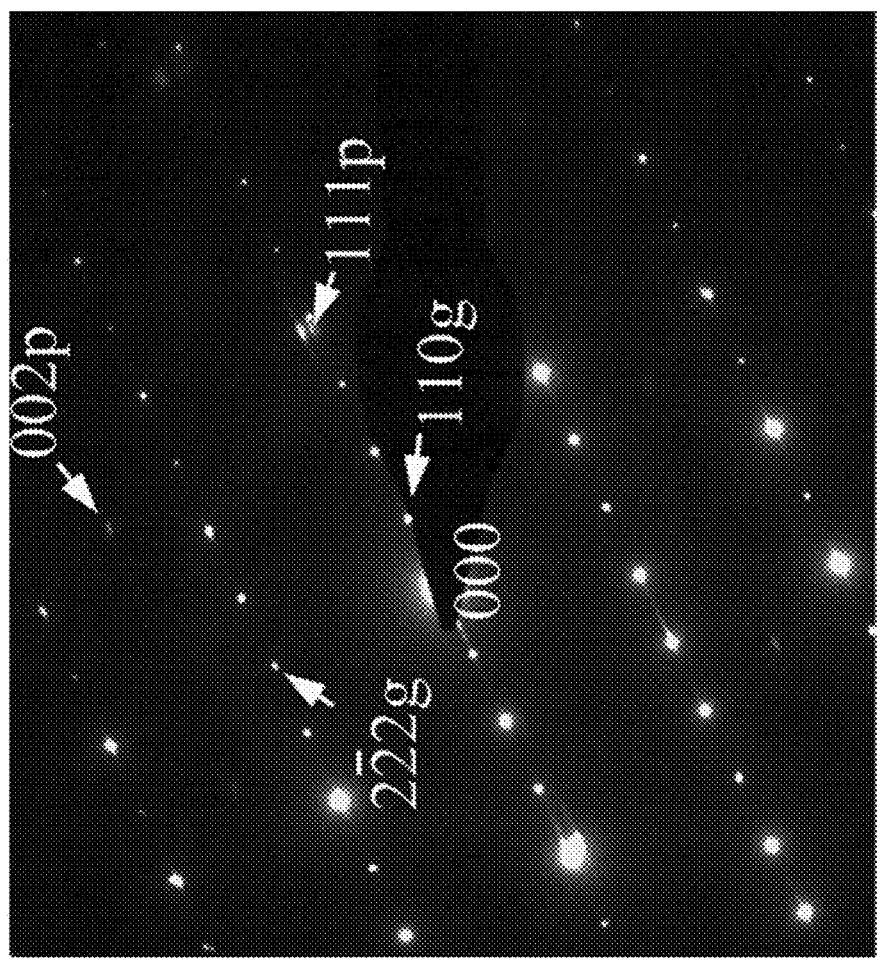
FIG. 17c is a selected area electron diffraction pattern along [$\bar{1}$12] zone axis in GGG obtained from an area containing all three layers showing diffraction spots of YIG, GGG, and Pt; the garnet reflections are labeled with subscript "g" and Pt ones with "p;"
Figure 17D:
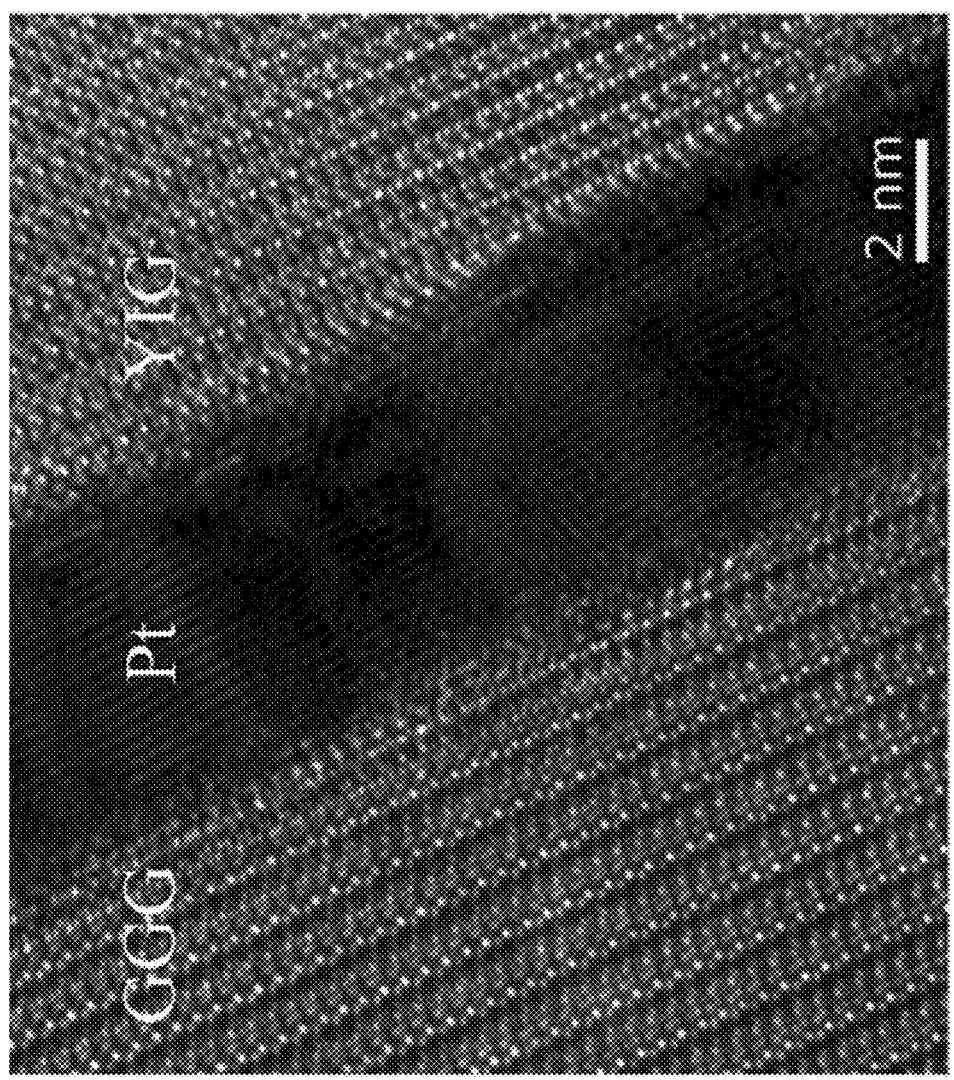
FIG. 17d is a high resolution transmission electron microscope (HRTEM) lattice image along the [$\bar{1}$12] zone axis in garnet shows that (110) planes in both YIG and GGG are parallel to the interface with the Pt film, and the latter is composed of nanometer size crystalline domains oriented with their (111) lattice planes parallel to the interface as well; slight bending and disruption of the (111) lattice fringes between adjacent Pt domains are visualized.

The locking of the (110) orientation in both YIG and GGG is further investigated by the high-resolution transmission electron microscopy (HRTEM) in real space. FIG. 17b first reveals sharp and clean interfaces of Pt/YIG and GGG/Pt. No amorphous phase or inclusions are visible at these two interfaces. Furthermore, the (110) atomic planes of YIG and GGG are parallel to each other and show very closely matched inter-planar spacing. Despite the Pt layer in between, the crystallographic orientation of YIG is not interrupted as if it were epitaxially grown on GGG directly. In the selected area electron diffraction pattern shown in FIG. 17c, taken along the (112) zone axis in garnet from an area that includes all three phases, YIG and GGG diffraction spots overlap with each other, consistent with the XRD results. There is minor splitting of the 110 type reflections from the two garnet phases due to a slight rotation of the two garnet lattices of less than 0.5°. Surprisingly, the diffraction spots from the 5 nm Pt layer show a single crystal pattern with minor streaking parallel to 111 in Pt. The diffuse character of the Pt reflections suggests that Pt is essentially a single crystal consisting of small (few nanometers) structural domains with minor misalignments. The contrast variation in different regions of Pt shown in FIG. 17b is consistent with such small structural domain misalignments in Pt crystal grain orientations. Furthermore, the 111 reciprocal vector of Pt and the 110 reciprocal vector of YIG/GGG are both perpendicular to the interfaces, indicating that the (111) Pt layers are parallel to the (110) layers of both GGG and YIG. FIG. 17d is a high resolution transmission electron microscope (HRTEM) image with high magnification of the three layers. It further reveals atomically sharp interfaces, interlocked (110) crystallographic orientations between GGG and YIG, and single crystal (111)-oriented Pt.

Figure 18B:
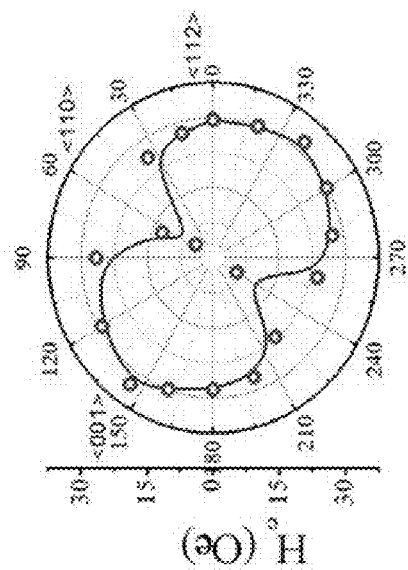
FIGS. 18a-18d illustrate magnetic properties of GGG (110)/Pt(5 nm)/YIG (40 nm) (a) Room temperature normalized magnetic hysteresis loops of YIG (40 nm)/Pt (5 nm)/GGG (110) with magnetic field applied in-plane and out-of-plane; Inset: in-plane hysteresis loop at low fields; (b) Polar plot of coercive field $H_c$ as the magnetic field H is set in different orientations in the (110) plane (H//(112) at 0°); (c) Polar plot of squareness $M_r/M_s$ as the magnetic field H is set in different orientations in the (110) plane (H//(112) at 0°); (d) FMR absorption derivative spectrum of YIG/Pt/GGG at an excitation frequency of 9.32 GHz; Lorentzian fit (red line) shows a single peak with a peak-peak distance of 7.5 Oe.
Figure 18D:
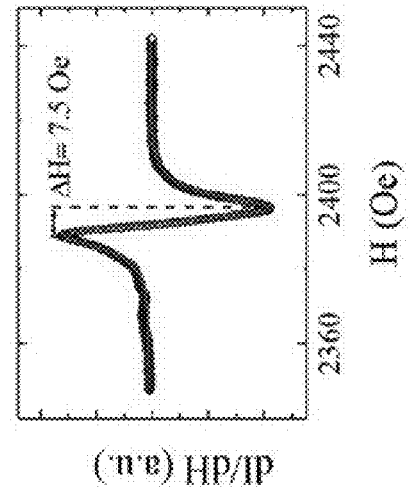
Figure 18A:
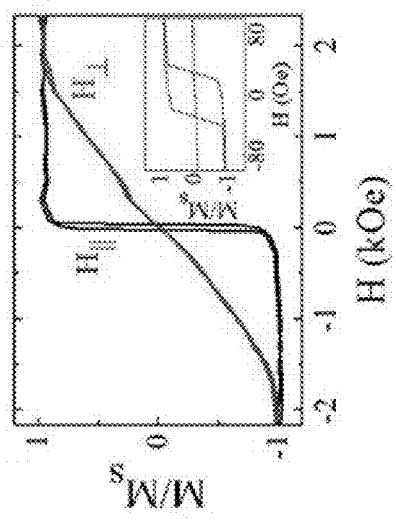
Figure 18C:
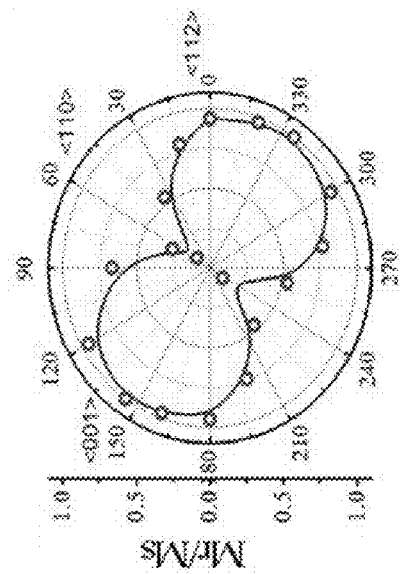

To investigate the magnetic properties of the GGG/Pt/YIG inverted heterostructure, vibrating sample magnetometry (VSM) measurements are carried out at room temperature. As-grown YIG films do not show any well-defined crystalline structure as indicated by the RHEED pattern. In the meantime, the VSM measurements do not show any detectable magnetization signal. Upon RTA, single crystal YIG becomes magnetic as shown by the hysteresis loops in FIG. 18a for magnetic fields parallel and perpendicular to the sample plane. GGG's paramagnetic contribution has been removed by subtracting the linear background from the raw data. The easy axis of all YIG films with different thicknesses lies in the film plane due to the dominant shape anisotropy. The coercivity falls in the range of 15-30 Oe for different thicknesses, which is larger than the typical value (0.2-5 Oe) [A9-A11] for YIG films grown on lattice-matched GGG. The inset of FIG. 18a shows a coercive field of 29 Oe for a 40 nm thick YIG film. The saturation magnetic field in the perpendicular direction is approximately 1800 Oe, which corresponds well to $4\pi M_s$ for bulk YIG crystals (1780 Oe). Magnetic hysteresis loops are measured along different directions in the film plane. FIGS. 18b and 18c show the polar angular dependence of both the coercively field ($H_c$) and squareness ($M_r/M_s$), where $M_r$ is the remanence and $M_s$ is the saturation magnetizations, respectively. In the film plane, there is clear uniaxial magnetic anisotropy, with the in-plane easy and hard axes situated along (001) at φ=145° and (110) at φ=55°, respectively. This two-fold symmetry indicates that the magnetocrystalline anisotropy is the main source of the anisotropy since it coincides with the lattice symmetry of (110) surface of the YIG films, which is also consistent with the magnetic anisotropy property of YIG epitaxially grown on GGG (110). [A10]

Ferromagnetic resonance (FMR) measurements of YIG films are carried out using Bruker EMX EPR (Electron Paramagnetic Resonance) spectrometer with an X-band microwave cavity operated at the frequency of f=9.32 GHz. A static magnetic field is applied parallel to the film plane. FIG. 18d shows a single FMR peak profile in the absorption derivative. From the Lorentzian fit, the peak-peak linewidth ($\Delta H_{pp}$) and resonance frequency ($H_{res}$) are 7.5 Oe and 2392 Oe, respectively. In literature, both the linewidth and the saturation magnetization vary over some range depending on the quality of YIG films. These values are comparable with the reported values for epitaxial YIG films grown directly on GGG. [A9-A11] The FMR linewidth here seems to be larger than what is reported in the best YIG films grown on GGG. Considering the excellent film quality, it is reasonable to assume that the same YIG would have similar FMR linewidth, e.g., 3 Oe. In the presence of Pt, increased damping in Pt/YIG occurs due to spin pumping. [A16, A17] This additional damping can explain the observed FMR linewidth (7.5 Oe) if a reasonable spin mixing conductance value of $g_{eff}$ of approximately $5 \times 10^{18}$ m$^2$ is assumed.

The Pt layer underneath YIG allows for pure spin current generation and detection just as when it is placed on top. It is known that the interface quality is critical to the efficiency of spin current transmission. [A18, A19] To characterize this property, spin Hall magnetoresistance (SMR) and SSE measurements in GGG/Pt/YIG inverted heterostructures are performed.

SMR is a transport phenomenon in bilayers of heavy metal/magnetic insulator. [A12, A20, A21] A charge current flowing in the normal metal with strong spin-orbit coupling generates a spin current orthogonal to the charge current via the spin Hall effect. The reflection and absorption of this spin current at the interface of the normal metal/magnetic insulator depends on the orientation of the magnetization ($\vec{M}$) of the magnetic insulator. Due to the spin transfer torque mechanism, when M is collinear with the spin polarization, $\vec{\sigma}$, reflection of the spin current is maximum. In contrast, when $\vec{M}$ is perpendicular to $\vec{\sigma}$, absorption is maximum; therefore, the resistance of the normal metal is larger than that for $\vec{M}$ parallel to $\vec{\sigma}$, since the absorption behaves as an additional dissipation channel. Metal/magnetic insulator interface quality affects the SMR magnitude. As illustrated in FIG. 19a, angle-dependent magnetoresistance (MR) measurements are performed by rotating a constant magnetic field in the xy- (H=2000 Oe), xz- (H=1 T), or yz-plane (H=1 T), while the current flows along the x-axis. The angular dependence of the MR ratio, $$\frac{\Delta \rho}{\rho}(\%) = \frac{\rho(\text{angle}) - \rho\left(\text{angle} - \frac{\pi}{2}\right)}{\rho\left(\text{angle} - \frac{\pi}{2}\right)} \times 100,$$

for Pt film at room temperature is summarized in FIG. 19b. As discussed above regarding Equation 1, according to the SMR theory [A21], the longitudinal resistivity is given by:

$$\sigma = \sigma_o + \sigma_1 m_y^2 \qquad (1)$$

The red solid curves in FIG. 19b can be well described by Equation 1. Here, the magnitude of SMR in xy- and yz scans is on the same order as that in normal YIG/Pt bilayer systems. Therefore, it has been demonstrated that the SMR mechanism dominates in embodiments of the pure spin valve devices, which indicates excellent interface quality for spin current transport.

SSE, on the other hand, is related to the transmission of thermally excited spin currents through the heavy metal/YIG interface. [A22-A24] As illustrated in FIG. 19c, a 300 nm thick Al$_2$O$_3$ layer is first deposited atop GGG (110)/Pt (5 nm)/YIG (40 nm), and a top heater layer consisting of 5 nm Cr and 50 nm Au. When an electrical current (50 mA) flows in the Cr/Au layer, a temperature gradient is established along the z-direction by Joule heating, which generates a spin current in YIG. As the spin current enters the Pt layer, it is converted into a charge current or voltage due to the inverse spin Hall effect. A magnetic field is applied in the y-direction while the voltage is detected along the x-direction. In FIG. 19d, the field dependence of the normalized SSE signal at 300 K is plotted, which is consistent with the SSE magnitude reported in YIG/Pt bilayers. [A24] Therefore, the excellent interface quality for transmitting thermally excited spin currents is confirmed.

In summary, single crystal YIG thin films have been grown on Pt film which is sputtered on GGG (110) substrate. RHEED and AFM show excellent YIG surface quality and morphology. XRD and HRTEM further reveal an intriguing crystal orientation locking between YIG and GGG as if no Pt were present. These YIG films exhibit similar excellent magnetic properties to those of the YIG films grown epitaxially on GGG (110). Both SMR and SSE results confirm that the superb structural and magnetic properties lead to excellent spin current transport properties.

Statements Regarding Incorporation by Reference and Variations

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Nothing herein is to be construed as an admission that the invention is not entitled to antedate such disclosure by virtue of prior invention.

Every formulation or combination of components described or exemplified herein can be used to practice the invention, unless otherwise stated.

Whenever a range is given in the specification, for example, a temperature range, a time range, or a composition or concentration range, all intermediate ranges and sub-ranges, as well as all individual values included in the ranges given are intended to be included in the disclosure. As used herein, ranges specifically include the values provided as endpoint values of the range. For example, a range of 1 to 100 specifically includes the end point values of 1 and 100. It will be understood that any sub-ranges or individual values in a range or sub-range that are included in the description herein can be excluded from the claims herein.

As used herein, the term "comprising" is synonymous with "including," "containing," or "characterized by," and is inclusive or open-ended and does not exclude additional, unrecited elements or method steps. As used herein, the phrase "consisting of" excludes any element, step, or ingredient not specified in the claim element. As used herein, the phrase "consisting essentially of" does not exclude materials or steps that do not materially affect the basic and novel characteristics of the claim. In each instance herein any of the terms "comprising", "consisting essentially of" and "consisting of" may be replaced with either of the other two terms. The embodiments illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the disclosed embodiments without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

The following documents are incorporated by reference in their entirety.

1. Dyakonov, M. I. & Perel, V. I. Current-induced spin orientation of electrons in semiconductors. *Phys. Lett. A*, 35, 459-460 (1971).
2. Hirsch, J. E. Spin Hall effect. *Phys. Rev. Lett.*, 83, 1834-1837 (1999).
3. Zhang, S. F. Spin Hall effect in the presence of spin diffusion. *Phys. Rev. Lett.*, 85, 393-396 (2000).
4. Valenzuela, S. O. & Tinkham, M. Direct electronic measurement of the spin Hall effect. *Nature*, 442, 176-179 (2006).
5. Kimura, T., Otani, Y., Sato, T., Takahashi, S. & Maekawa, S. Room-temperature reversible spin Hall effect. *Phys. Rev. Lett.*, 98, 156601 (2007).
6. Miron, I. M. et al. Perpendicular switching of a single ferromagnetic layer induced by in-plane current injection. *Nature*, 476, 189-193 (2011).
7. Liu, L. Q. et al. Spin torque switching with the giant spin Hall effect of tantalum. *Science*, 336, 555-558 (2012).
8. Gurevich, A. & Melkov, G. Magnetization oscillations and waves. (CRC Press, 1996).
9. Kittel, C. Introduction to Solid State Physics 8th Ed., Ch. 12 and 13 (Wiley, 2005).
10. Demokritov, S. O., Hillebrands, B. & Slavin, A. N. Brillouin light scattering studies of confined spin waves: linear and nonlinear confinement. *Phys. Rep.*, 348, 441-489 (2001).
11. Serga, A. A., Chumak, A. V. & Hillebrands, B. YIG magnonics. *J. Phys. D*, 43, 264002 (2010).
12. Takahashi, S., Saitoh, E. & Maekawa, S. Spin current through a normal-metal/insulating-ferromagnet Junction. *J. Phys. Conf. Ser.*, 200, 062030 (2010).
13. Zhang, S. S.-L. & Zhang, S. Magnon Mediated Electric Current Drag Across a Ferromagnetic Insulator Layer. *Phys. Rev. Lett.*, 109, 096603 (2012).
14. Zhang, S. S.-L. & Zhang, S. Spin convertance at magnetic interfaces. *Phys. Rev. B*, 86, 214424 (2012).

15. Saitoh, E. et al. Conversion of spin current into charge current at room temperature: Inverse spin-Hall effect. *Appl. Phys. Lett.*, 88, 182509 (2006).
16. Mosendz, O. et al. Quantifying Spin Hall Angles from Spin Pumping: Experiments and Theory. *Phys. Rev. Lett.*, 104, 046601 (2010).
17. Vlaminck, V. et al. Dependence of spin-pumping spin Hall effect measurements on layer thicknesses and stacking order. *Phys. Rev. B*, 88, 064414 (2013).
18. Zhang, W. et al. Spin Hall Effects in Metallic Antiferromagnets. *Phys. Rev. Lett.* 113, 196602 (2014).
19. Uchida, K. et al. Spin Seebeck insulator. *Nat. Mater.* 9, 894-7 (2010).
20. Schreier, M. et al. Magnon, phonon, and electron temperature profiles and the spin Seebeck effect in magnetic insulator/normal metal hybrid structures. *Phys. Rev. B*, 88, 094410 (2013).
21. Kikkawa, T. et al., Critical suppression of spin Seebeck effect by magnetic fields. *Phys. Rev. B*, 92, 064413 (2015).
22. Jin, H., Boona, S. R., Yang, Z., Myers, R. C. & Heremans, J. P. Effect of the magnon dispersion on the longitudinal spin Seebeck effect in yttrium iron garnets. *Phys. Rev. B*, 92, 054436 (2015).
23. Kajiwara, Y. et al. Transmission of electrical signals by spin-wave interconversion in a magnetic insulator. *Nature*, 464, 262-266 (2010).
24. Slonczewski, J. C., Current-driven excitation of magnetic multilayers. *J. Magn. Magn. Mater.*, 159, L1 (1996).
25. Berger, L. Emission of spin waves by a magnetic multilayer traversed by a current. *Phys. Rev. B*, 54, 9353 (1996).
26. Baibich, M. N. et al. Giant Magnetoresistance of (001)Fe/(001)Cr Magnetic Superlattices. *Phys. Rev. Lett.*, 61, 2472 (1988).
27. Binasch, G., Grunberg, P., Saurenbach, F. & Zinn, W. Enhanced magnetoresistance in layered magnetic structures with antiferromagnetic interlayer exchange. *Phys. Rev. B*, 39, 4828 (1989).
28. Giles, B. L., Yang, Z., Jamison, J. & Myers, R. C. Long range pure magnon spin diffusion observed in a non-local spin-Seebeck geometry. Phys. Rev. B 92,224415 (2015).
29. Cornelissen, L. J. et al. Long distance transport of magnon spin information in a magnetic insulator at room temperature. *Nat. Phys.*, 11, 453-461 (2015).
30. Liu, L. Q. et al. Spin torque switching with the giant spin Hall effect of tantalum. *Science*, 336, 555-558 (2012).
31. Tanaka, T. et al. Intrinsic spin Hall effect and orbital Hall effect in 4d and 5d transition metals. *Phys. Rev. B*, 77, 165117 (2008).
32. Morota, M. et al. Indication of intrinsic spin Hall effect in 4d and 5d transition metals. *Phys. Rev. B*, 83, 174405 (2011).
33. Lin, T. et al. Experimental Investigation of the Nature of the Magnetoresistance Effects in Pd-YIG Hybrid Structures. *Phys. Rev. Lett.*, 113, 037203 (2014).
34. Nakayama, H. et al. Spin Hall Magnetoresistance Induced by a Non-equilibrium Proximity Effect. *Phys. Rev. Lett.*, 110, 206601 (2013).
35. Chen, Y.-T. et al. Theory of spin Hall magnetoresistance. *Phys. Rev. B*, 87, 144411 (2013).
S1. Lin, T. et al., J. Induced magneto-transport properties at palladium/yttrium iron garnet interface. *Appl. Phys. Lett.*, 103, 132407 (2013).
S2. Lin, T. et al., Experimental Investigation of the Nature of the Magnetoresistance Effects in Pd-YIG Hybrid Structures. *Phys. Rev. Lett.*, 113, 037103 (2014).
S3. Jiang, Z. et al., A comparative transport study of $Bi_2Se_3$ and $Bi_2Se_3$/yttrium iron garnet. *Appl. Phys. Lett.*, 104, 222409 (2014).
S4. Jiang Z. et al., Independent Tuning of Electronic Properties and Induced Ferromagnetism in Topological Insulators with Heterostructure Approach. *Nano Lett.*, 15(9), 5835-5840(2015).
S5. Nakayama, H. et al., Spin Hall Magnetoresistance Induced by a Non-equilibrium Proximity Effect. *Phys. Rev. Lett.*, 110, 206601 (2013).
S6. Chen, Y.-T. et al., Theory of spin Hall magnetoresistance. *Phys. Rev. B*, 87, 144411 (2013).
S7. Althammer, M. et al., Quantitative study of the spin Hall magnetoresistance in ferromagnetic insulator/normal metal hybrids. *Phys. Rev. B*, 87, 224401 (2013).
S8. Hahn, C. et al., Comparative measurements of inverse spin Hall effects and magnetoresistance in YIG/Pt and YIG/Ta. *Phys. Rev. B*, 87, 174417 (2013).
S9. Vlietstra, N. et al., Spin-Hall magnetoresistance in platinum on yttrium iron garnet: Dependence on platinum thickness and in-plane/out-of-plane magnetization. *Phys. Rev. B*, 87, 184421 (2013).
S10. Huang, S. Y. et al., Transport magnetic proximity effects in platinum. *Phys. Rev. Lett.*, 109, 107204 (2012).
S11. Lu, Y. M. et al., Hybrid magnetoresistance in the proximity of a ferromagnet. *Phys. Rev. B*, 87, 220409 (2013).
S12. Lu, Y. M. et al., Pt Magnetic Polarization on $Y_3Fe_5O_{12}$ and Magnetotransport Characteristics. *Phys. Rev. Lett.*, 110, 147207 (2013).
S13. Goennenwein, S. T. B. et al. Non-local magnetoresistance in YIG/Pt nanostructures. Appl. Phys. Lett. 107, 172405 (2015).
A1. G. Winkler, Magnetic Garnets (Vieweg, Braunschweig, Wiesbaden, 1981).
A2. Geller and M. A. Gilleo, *Acta Crystallogr.* 10, 239 (1957).
A3. V. Chumak, A. A. Serga, and B. Hillebrands, *Nat. Commun.*, 5, 4700 (2014).
A4. M. Sparks, Ferromagnetic-Relaxation Theory (Mc Graw-Hill, New York, 1964).
A5. X. Jia, K. Liu, K. Xia, and G. E. Bauer, *Europhys. Lett.*, 96, 17005 (2011).
A6. R. C. Linares, R. B. Graw, and J. B. Schroeder, *J. Appl. Phys.*, 36, 2884 (1965).
A7. D. Qu, S. Y. Huang, J. Hu, R. Wu, and C. L. Chien, *Phys. Rev. Lett.*, 110, 067206 (2013).
A8. B. Heinrich, C. Burrowes, E. Montoya, B. Kardasz, E. Girt, Y. Y. Song, Y. Sun, and M. Wu, *Phys. Rev. Lett.*, 107, 066604 (2010).
A9. M. C. Onbasli, A. Kehlberger, D. H. Kim, G. Jakob, M. Klaui, A. V. Chumak, B. Hillebrands, and C. A. Ross, *APL Mater.* 2, 106102 (2014).
A10. C. Tang, M. Aldosary, Z. Jiang, H. Chang, B. Madon, K. Chan, M. Wu, J. E. Garay, and J. Shi, *Appl. Phys. Lett.*, 108, 102403 (2016).
A11. H. Chang, P. Li, W. Zhang, T. Liu, A. Hoffmann, L. Deng, and M. Wu, *IEEE Magn. Lett.*, 5, 6700104 (2014).
A12. T. Lin, C. Tang, H. M. Alyahayaei, and J. Shi, *Phys. Rev. Lett.*, 113, 037203 (2014).
A13. S. S.-L. Zhang and S. Zhang, *Phys. Rev. Lett.*, 109, 096603 (2012).

A14. J. Li, Y. Xu, M. Aldosary, C. Tang, Z. Lin, S. Zhang, R. Lake, and J. Shi, *Nat. Commun.*, 7, 10858 (2016).
A15. Y. Krockenberger, H. Matsui, T. Hasegawa, M. Kawasaki, and Y. Tokura, *Appl. Phys. Lett.*, 93, 092505 (2008).
A16. C. Burrowes, B. Heinrich, B. Kardasz, E. A. Montoya, E. Girt, Y. Sun, Y.-Y. Song, and M. Wu, *Appl. Phys. Lett.*, 100, 092403 (2012).
A17. J. Lustikova, Y. Shiomi, Z. Qiu, T. Kikkawa, R. Iguchi, K. Uchida, and E. Saitoh, *J. Appl. Phys.*, 116, 153902 (2014).
A18. M. Weiler, M. Althammer, M. Schreier, J. Lotze, M. Pernpeintner, S. Meyer, H. Huebl, R. Gross, A. Kamra, J. Xiao, Y.-T. Chen, H. J. Jiao, G. E. W. Bauer, and S. T. B. Goennenwein, *Phys. Rev. Lett.*, 111, 176601 (2013).
A19. Y. M. Lu, J. W. Cai, S. Y. Huang, D. Qu, B. F. Miao, and C. L. Chien, *Phys. Rev. B*, 87, 220409 (2013).
A20. H. Nakayama, M. Althammer, Y.-T. Chen, K. Uchida, Y. Kajiwara, D. Kikuchi, T. Ohtani, S. Geprags, M. Opel, S. Takahashi, R. Gross, G. E. W. Bauer, S. T. B. Goennenwein, and E. Saitoh, *Phys. Rev. Lett.*, 110, 206601 (2013).
A21. Y.-T. Chen, S. Takahashi, H. Nakayama, M. Althammer, S. T. B. Goennenwein, E. Saitoh, and G. E. W. Bauer, *Phys. Rev. B*, 87, 144411 (2013).
A22. M. Schreier, A. Kamra, M. Weiler, J. Xiao, G. E. W. Bauer, R. Gross, and S. T. B. Goennenwein, *Phys. Rev. B*, 88, 094410 (2013).
A23. S. M. Rezende, R. L. Rodriguez-Suarez, J. C. Lopez Ortiz, and A. Azevedo, *Phys. Rev. B*, 89, 134406 (2014).
A24. D. Meier, D. Reinhardt, M. van Straaten, C. Klewe, M. Althammer, M. Schreier, S. T. B. Goennenwein, A. Gupta, M. Schmid, C. H. Back, J.-M. Schmalhorst, T. Kuschel, and G. Reiss, *Nat. Commun.* 6, 8211 (2015).

What is claimed is:

1. A pure spin current valve device, comprising:
a first metal layer extending within a first plane defined by first and second orthogonal axes;
a second metal layer extending within a second plane approximately parallel to the first plane; and
a magnetic insulator layer extending within a third plane approximately parallel to the first plane, the magnetic insulator contacting the first metal layer at a first interface and contacting the second metal layer at a second interface, the first and second interfaces opposing one other;
wherein the first metal layer is configured to generate a pure spin current upon receipt of a first electrical current, the pure spin current flowing towards the first interface in a direction of a third axis, orthogonal to the first and second axes, and possessing a spin current polarization ($\vec{\sigma}$) oriented parallel to the first plane;
wherein the magnetic insulator layer is configured to exhibit a magnetization ($\vec{M}$) oriented parallel to the second plane and at an angle ($\theta$) with respect to the spin current polarization; and
wherein the second metal layer is configured to generate a second current upon receipt of the pure spin current from the magnetic insulator layer.

2. The device of claim 1, wherein the second current is proportional to the first current when $\theta=0°$.

3. The device of claim 1, wherein the second current is zero when the magnetization is perpendicular to the spin current polarization.

4. The device of claim 1, wherein the second current is non-zero when the first current is non-zero and when the magnetization is not perpendicular to the spin current polarization.

5. The device of claim 1, wherein the first and second metal layers are each independently selected from metals selected from the group consisting of platinum (Pt), tantalum (Ta), tungsten (W), bismuth (Bi), and alloys thereof.

6. The device of claim 1, wherein the first and second metal layers possess a spin Hall angle greater than or equal to 1%.

7. The device of claim 1, wherein the magnetic insulator layer comprises a magnetic insulator material selected from the group consisting of yttrium aluminum garnet (YIG), and rare earth iron garnets (ReIG).

8. The device of claim 1, wherein the magnetic insulator layer comprises a rare earth iron garnet selected from europium iron garnet (EuIG) and lutetium iron garnet (LuIG).

9. The device of claim 1, further comprising a substrate underlying one of the first and second metal layers, the substrate comprising a material selected from the group consisting of gadolinium gallium garnet (GGG; $Gd_3Ga_5O_{12}$), yttrium aluminum garnet (YAG; $Y_3Al_5O_{15}$), strontium titanium oxide (STO; $SrTiO_3$), neodymium gallium garnet (NGG; $Nd_3Ga_5O_{12}$), and silicon (Si).

10. The device of claim 9, wherein a root mean squared (RMS) roughness of the substrate is approximately 10% or less than the thickness of the overlying first or second metal layer.

11. A method of forming a spin current valve, comprising:
forming a first metal layer on a substrate layer;
forming a magnetic insulator layer on the first metal layer; and
forming a second metal layer on the magnetic insulator layer;
wherein the first metal layer is configured to generate a pure spin current upon receipt of a first electrical current, the pure spin current flowing towards the first interface in a direction of a third axis, orthogonal to the first and second axes, and possessing a spin current polarization ($\vec{\sigma}$) oriented parallel to the first plane;
wherein the magnetic insulator layer is configured to exhibit a magnetization ($\vec{M}$) oriented parallel to the second plane and at an angle ($\theta$) with respect to the spin current polarization; and
wherein the second metal layer is configured to generate a second current upon receipt of the pure spin current from the magnetic insulator layer.

12. The method of claim 11, wherein the second current is proportional to the first current when $\theta=0°$.

13. The method of claim 11, wherein the second current is zero when the magnetization is perpendicular to the spin current polarization.

14. The method of claim 11, wherein the second current is non-zero when the first current is non-zero and when the magnetization is not perpendicular to the spin current polarization.

15. The method of claim 11, wherein the first and second metal layers are each independently selected from metals selected from the group consisting of platinum (Pt), tantalum (Ta), tungsten (W), bismuth (Bi), and alloys thereof.

16. The method of claim 11, wherein the first and second metal layers possess a spin Hall angle greater than or equal to 1%.

17. The method of claim 11, wherein the magnetic insulator layer comprises a magnetic insulator material selected from the group consisting of yttrium aluminum garnet (YIG) and rare earth iron garnets (ReIG).

18. The method of claim 11, wherein the magnetic insulator layer comprises a rare earth iron garnet selected from europium iron garnet (EuIG) and lutetium iron garnet (LuIG).

19. The method of claim 11, further comprising a substrate underlying one of the first and second metal layers, the substrate comprising a material selected from the group consisting of gadolinium gallium garnet (GGG; $Gd_3Ga_5O_{12}$), yttrium aluminum garnet (YAG; $Y_3Al_5O_{15}$), strontium titanium oxide (STO; $SrTiO_3$), neodymium gallium garnet (NGG; $Nd_3Ga_5O_{12}$), and silicon (Si).

20. The method of claim 11, wherein a root mean squared (RMS) roughness of the substrate is approximately 10% or less than the thickness of the first metal layer.

* * * * *